(12) United States Patent
Shimura et al.

(10) Patent No.: US 11,009,351 B2
(45) Date of Patent: May 18, 2021

(54) VIBRATOR DEVICE INCLUDING REDUCED MOUNTING STRESS AND FREQUENCY VARIATION

(71) Applicant: SEIKO EPSON CORPORATION, Tokyo (JP)

(72) Inventors: Masashi Shimura, Chino (JP); Atsushi Matsuo, Shiojiri (JP); Shinya Aoki, Minowa-machi (JP); Shiro Murakami, Shiojiri (JP); Ryuta Nishizawa, Nagano (JP)

(73) Assignee: SEIKO EPSON CORPORATION, Tokyo (JP)

( * ) Notice: Subject to any disclaimer, the term of this patent is extended or adjusted under 35 U.S.C. 154(b) by 140 days.

(21) Appl. No.: 16/232,112

(22) Filed: Dec. 26, 2018

(65) Prior Publication Data

US 2019/0195630 A1   Jun. 27, 2019

(30) Foreign Application Priority Data

Dec. 27, 2017   (JP) .............................. JP2017-252478

(51) Int. Cl.
   *G01C 19/56*     (2012.01)
   *G01C 19/5642*   (2012.01)
   *H01L 41/09*     (2006.01)
   *H03B 5/32*      (2006.01)
   *H01L 41/047*    (2006.01)
   (Continued)

(52) U.S. Cl.
   CPC ..... *G01C 19/5642* (2013.01); *G01C 19/5607* (2013.01); *H01L 41/047* (2013.01); *H01L 41/09* (2013.01); *H03B 5/32* (2013.01); *H03H 3/04* (2013.01); *H03H 9/02133* (2013.01); *H03H 9/0519* (2013.01); *H03H 9/0552* (2013.01); *H03H 9/09* (2013.01); *H03H 9/1021* (2013.01);
   (Continued)

(58) Field of Classification Search
   None
   See application file for complete search history.

(56) References Cited

U.S. PATENT DOCUMENTS

2005/0284223 A1*  12/2005  Karaki ................... G01C 19/56
                                              73/504.12
2013/0255379 A1*  10/2013  Nakagawa ......... G01C 19/5621
                                              73/504.16
(Continued)

FOREIGN PATENT DOCUMENTS

JP              2015-195593 A       11/2015

*Primary Examiner* — Lisa M Caputo
*Assistant Examiner* — Nigel H Plumb
(74) *Attorney, Agent, or Firm* — Oliff PLC

(57) ABSTRACT

A vibrator device includes a base, a first relay substrate mounted on the base, a second relay substrate mounted on the first relay substrate, and a vibrator element mounted on the second relay substrate, in which the second relay substrate is disposed between the first relay substrate and the vibrator, and the second relay substrate includes a terminal that is electrically coupled to the vibrator element and is positioned in a region overlapping with the first relay substrate and not overlapping the vibrator element in a plan view. The vibrator device being configured to reduce a mounting stress applied to a vibrator element and to reduce frequency variation of the vibrator element due to the mounting stress, in a case of mounting on a package after adjusting a frequency of the vibrator element.

12 Claims, 18 Drawing Sheets

(51) Int. Cl.
*H03H 9/15* (2006.01)
*G01C 19/5607* (2012.01)
*H03H 9/05* (2006.01)
*H03H 3/04* (2006.01)
*H03H 9/09* (2006.01)
*H03H 9/10* (2006.01)
*H03H 9/19* (2006.01)
*H03H 9/02* (2006.01)

(52) U.S. Cl.
CPC ............... *H03H 9/15* (2013.01); *H03H 9/19* (2013.01); *H03H 2003/0428* (2013.01)

(56) References Cited

U.S. PATENT DOCUMENTS

| | | | |
|---|---|---|---|
| 2013/0255387 A1* | 10/2013 | Hanaoka | G01C 19/5621 73/649 |
| 2013/0335157 A1* | 12/2013 | Ishii | H03B 5/368 331/158 |
| 2014/0298908 A1* | 10/2014 | Ichikawa | G01P 3/16 73/504.12 |
| 2016/0075549 A1* | 3/2016 | Aoki | B81B 3/0086 257/417 |
| 2017/0067790 A1* | 3/2017 | Takeuchi | G01L 19/02 |
| 2018/0274922 A1* | 9/2018 | Nishizawa | G01C 19/5621 |
| 2019/0165759 A1* | 5/2019 | Nishizawa | H03H 9/19 |

* cited by examiner

VIBRATOR DEVICE INCLUDING REDUCED MOUNTING STRESS AND FREQUENCY VARIATION

BACKGROUND

1. Technical Field

The present invention relates to a vibrator device, a method of manufacturing a vibrator device, an electronic apparatus, and a vehicle.

2. Related Art

A quartz crystal oscillator described in JP-A-2015-195593 has a package, an IC chip stored in the package, a substrate for measurement, and a quartz crystal vibrator element. In addition, in such a quartz crystal oscillator, first, a frequency of the quartz crystal vibrator element is adjusted in a state where the quartz crystal vibrator element is fixed to the substrate for measurement. Thereafter, the frequency of the quartz crystal vibrator element is adjusted again in a state where the substrate for measurement is fixed to the package.

However, in such a method of adjusting the frequency of the quartz crystal vibrator element, since the frequency of the quartz crystal vibrator element is adjusted in the state where the quartz crystal vibrator element is fixed to the substrate for measurement, and thereafter, the substrate for measurement is fixed to the package, the frequency of the quartz crystal vibrator element varies depending on amounting stress. As a result, a frequency adjustment of the quartz crystal vibrator element after fixing to the package is complicated.

SUMMARY

An advantage of some aspects of the invention is to provide a vibrator device that reduces a mounting stress applied to a vibrator element and reduces frequency variation of the vibrator element due to the mounting stress, in a case of mounting on a package after adjusting a frequency of the vibrator element, a method of manufacturing a vibrator device, an electronic apparatus, and a vehicle.

The invention can be implemented as the following application examples or embodiments.

A vibrator device according to an application example includes a base, a first relay substrate mounted on the base, a second relay substrate mounted on the first relay substrate, and a vibrator element mounted on the second relay substrate, in which the second relay substrate is disposed between the first relay substrate and the vibrator, and the second relay substrate includes a terminal that is electrically coupled to the vibrator element and is positioned in a region overlapping with the first relay substrate and not overlapping the vibrator element in a plan view.

With this configuration, it is possible to measure the oscillation frequency of the vibrator element through the terminal of the second relay substrate, so that it is possible to adjust the frequency of the vibrator element. Thereafter, in a case of mounting the first relay substrate on the base (package), the mounting stress applied to the second relay substrate and the vibrator element is reduced, and frequency variation of the vibrator element after the frequency adjustment is suppressed.

In the vibrator device according to the application example, it is preferable that the terminal is disposed on a surface of the second relay substrate on aside of the vibrator element.

With this configuration, it is likely to apply a probe (terminal for inspection) to the terminal, and the frequency of the vibrator element is measured easily.

In the vibrator device according to the application example, it is preferable that the second relay substrate includes a first portion mounted on the first relay substrate, a second portion on which the vibrator element is disposed, and a connection portion that connects the first portion and the second portion.

With this configuration, the stress generated due to the deformation of the first relay substrate and the base is unlikely to be transmitted to the vibrator element. Therefore, the variation in the frequency characteristics of the vibrator element can be suppressed.

In the vibrator device according to the application example, it is preferable that the connection portion includes a third portion, a first beam portion that connects the first portion and the third portion on a first axis, and a second beam portion that connects the second portion and the third portion on a second axis intersecting with the first axis.

With this configuration, the stress generated due to the deformation of the first relay substrate and the base is unlikely to be transmitted to the vibrator element. Therefore, the variation in the frequency characteristics of the vibrator element can be effectively suppressed.

In the vibrator device according to the application example, it is preferable that the first portion has a frame shape, the third portion has a frame shape and is positioned inside the first portion, and the second portion is positioned inside the third portion.

With this configuration, the size of the second relay substrate can be reduced.

In the vibrator device according to the application example, it is preferable that the first portion is mounted on the first relay substrate through bonding members on both sides with respect to the first axis in a direction intersecting with the first axis.

With this configuration, the second relay substrate is stably supported by the first relay substrate.

In the vibrator device according to the application example, it is preferable that the terminal is disposed to overlap with each of the bonding members in a plan view.

With this configuration, it is possible to suppress deflection of the second relay substrate when the terminal is pressed against the probe. Therefore, the stress generated due to deformation of the second relay substrate during frequency measurement is unlikely to be transmitted to the vibrator element, and the frequency measurement of the vibrator element can be performed with higher accuracy.

In the vibrator device according to the application example, it is preferable that a bonding portion to be mounted on the base of the first relay substrate is disposed in a region not overlapping with the second relay substrate and the vibrator element in a plan view.

With this configuration, the stress generated due to the deformation of the base is unlikely to be transmitted to the second relay substrate or the vibrator element. Therefore, the mounting stress applied to the second relay substrate and the vibrator element is reduced, and the frequency variation of the vibrator element is suppressed.

In the vibrator device according to the application example, it is preferable that the device includes a lid body that is bonded to the base so as to store the first relay substrate, the second relay substrate, and the vibrator element between the lid body and the base.

With this configuration, the first relay substrate, the second relay substrate, and the vibrator element can be protected.

In the vibrator device according to the application example, it is preferable that the first relay substrate is a circuit element having a drive circuit of the vibrator element.

With this configuration, the vibrator element can be easily driven.

A method of manufacturing a vibrator device according to an application example includes preparing a laminated structure that includes a first relay substrate, a second relay substrate mounted on the first relay substrate, and a vibrator element which is disposed so as to sandwich the second relay substrate with the first relay substrate, and is mounted on the second relay substrate, and measuring a frequency of the vibrator element, in which the second relay substrate includes a terminal that is electrically coupled to the vibrator element and is positioned in a region overlapping with the first relay substrate and not overlapping the vibrator element in a plan view, and in the measuring of the frequency of the vibrator element, frequency measurement of the vibrator element is performed through the terminal.

With this configuration, by measuring the frequency of the vibrator element before being stored in the package, the frequency can be adjusted. Thereafter, in a case of mounting the first relay substrate on the base (package), the mounting stress applied to the second relay substrate and the vibrator element is reduced, and frequency variation of the vibrator element after the frequency adjustment is suppressed.

In the method of manufacturing a vibrator device according to the application example, it is preferable that the method includes measuring a frequency of the vibrator element in a state not supported by the second relay substrate, before the preparing of the laminated structure.

With this configuration, since the frequency of the vibrator element can be measured before forming the laminated structure, the frequency can be roughly adjusted and the frequency of the vibrator element can be finely adjusted after forming the laminated structure. Therefore, it is possible to reduce a processing amount of an excitation electrode in a state where the laminated structure is formed, and to reduce damage to the first relay substrate.

In the method of manufacturing a vibrator device according to the application example, it is preferable that the vibrator element includes a vibrator substrate, a first excitation electrode disposed on one main surface of the vibrator substrate, and a second excitation electrode disposed on the other main surface, in the measuring of the frequency of the vibrator element in a state not supported by the second relay substrate, the first excitation electrode is processed, and in the measuring of the frequency of the vibrator element in a state of the laminated structure, the second excitation electrode is processed.

With this configuration, it is possible to process the first and second excitation electrodes for adjusting the frequency of the vibrator element to reduce the respective mass differences. Therefore, deterioration of vibration characteristics of the vibrator element can be suppressed.

In the method of manufacturing a vibrator device according to the application example, it is preferable that the method includes disposing the first relay substrate on the base, and bonding a lid body to the base so as to store the laminated structure between the lid body and the base, after the measuring of the frequency of the vibrator element in the state of the laminated structure.

With this configuration, the laminated structure can be protected from moisture, dust, shock, and the like.

An electronic apparatus according to an application example includes the vibrator device according to the application example.

With this configuration, it is possible to enjoy the effect of the vibrator device of the above application example and to obtain the electronic apparatus with high reliability.

A vehicle according to an application example includes the vibrator device according to the application example.

With this configuration, it is possible to enjoy the effect of the vibrator device of the above application example and to obtain the vehicle with high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a vibrator device, a method of manufacturing a vibrator device, an electronic apparatus, and a vehicle according to the invention will be described in detail based on embodiments illustrated in the accompanying drawings.

First Embodiment

Figure 1:
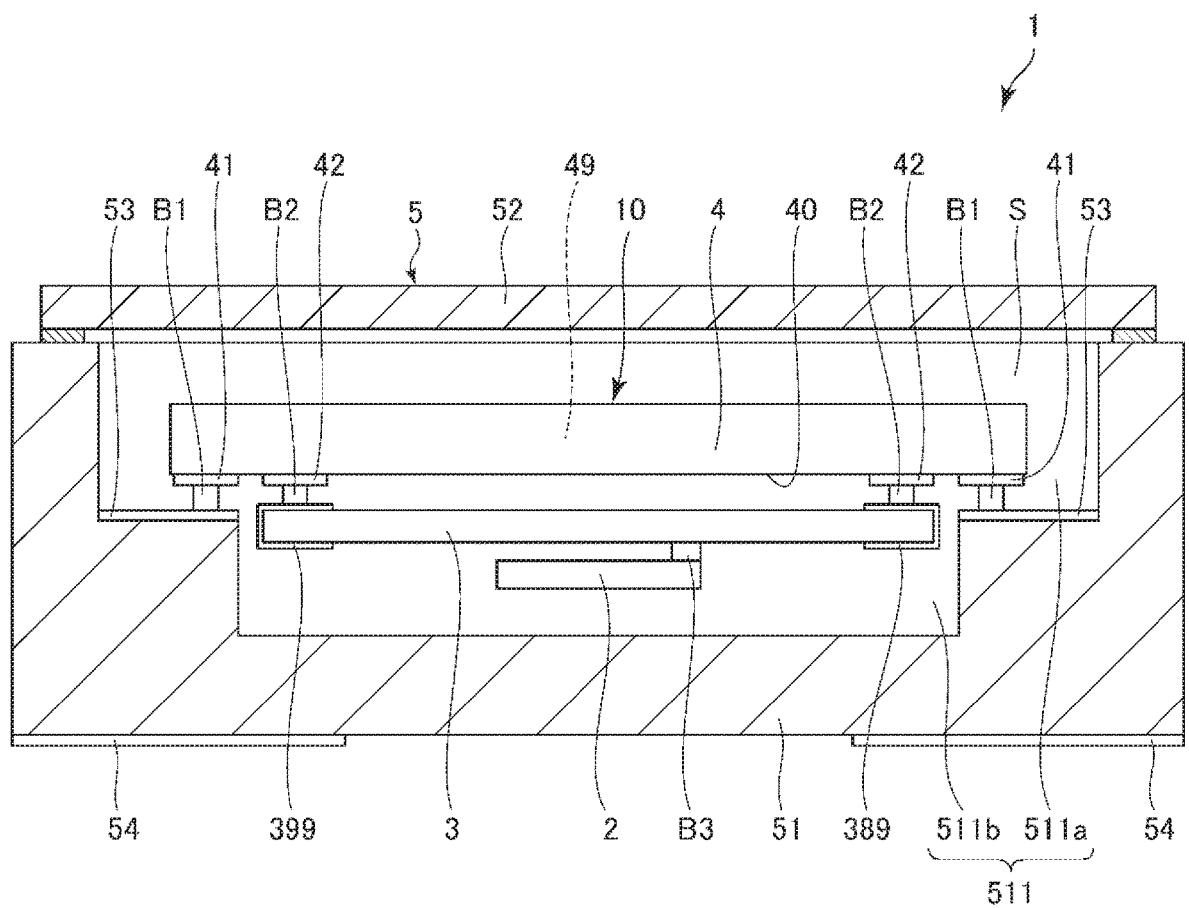
FIG. 1 is a cross-sectional view illustrating a vibrator device according to a first embodiment of the invention.
Figure 2:
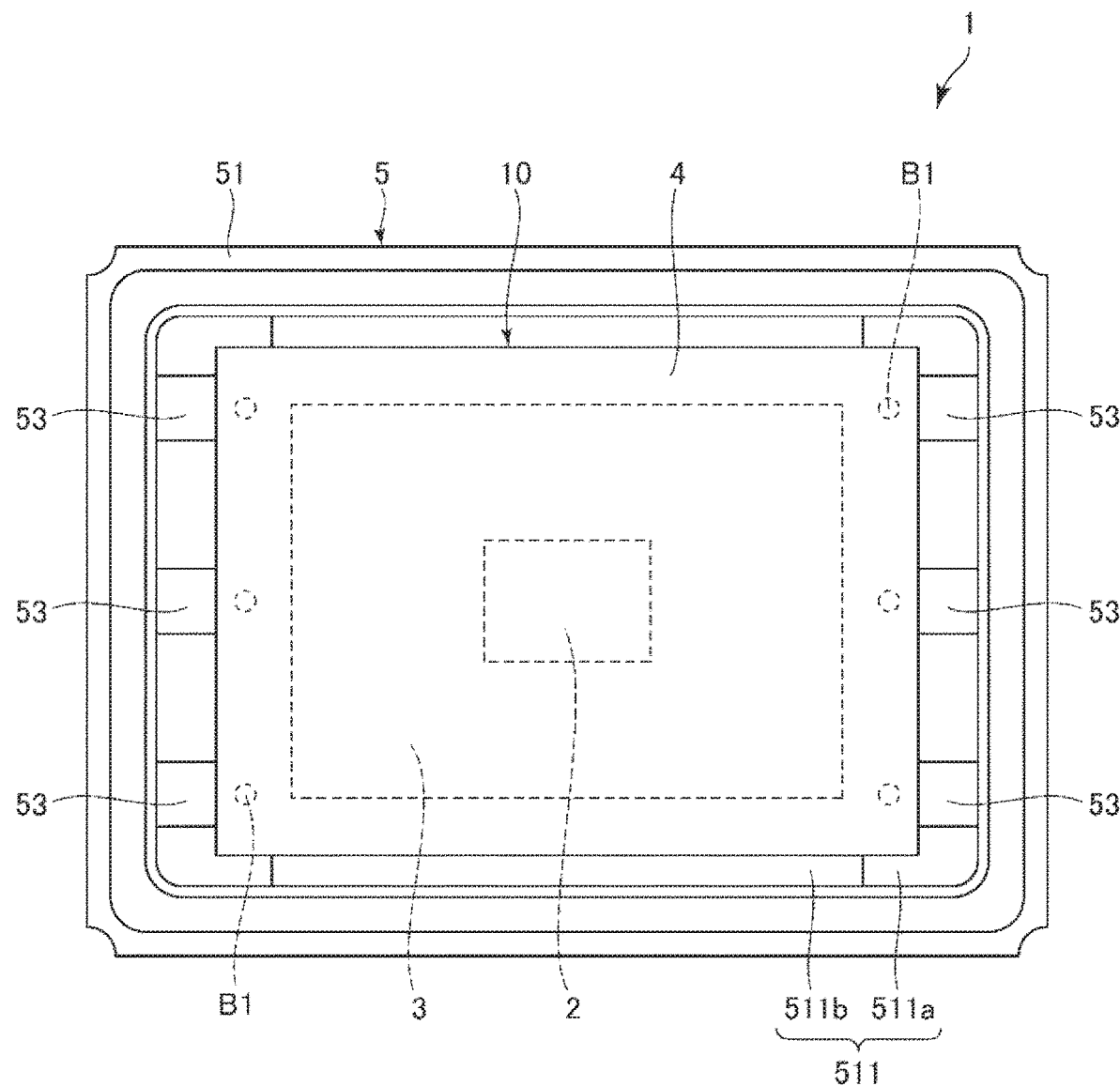
FIG. 2 is a top view illustrating the vibrator device of FIG. 1 in a case where a lid is removed.
Figure 3:
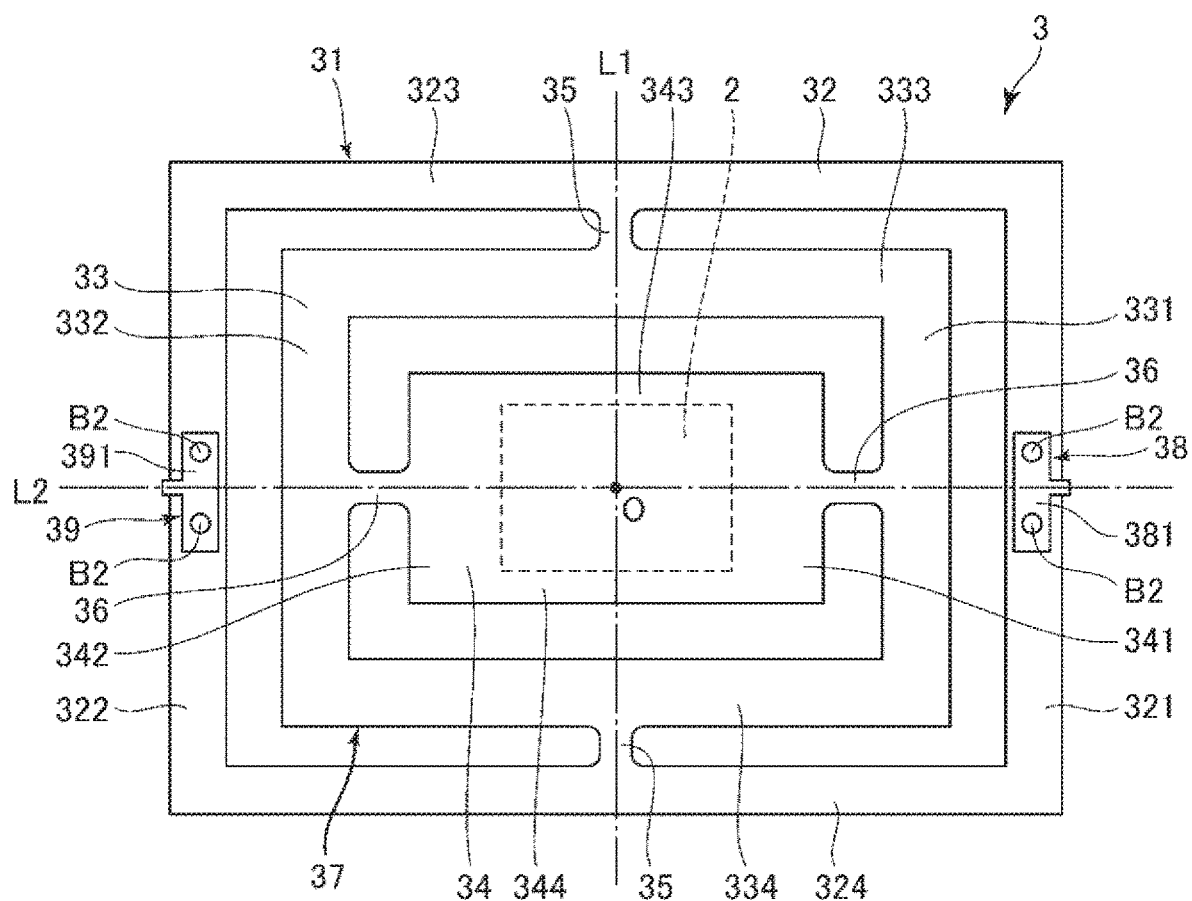
FIG. 3 is a top view illustrating a relay substrate.
Figure 4:
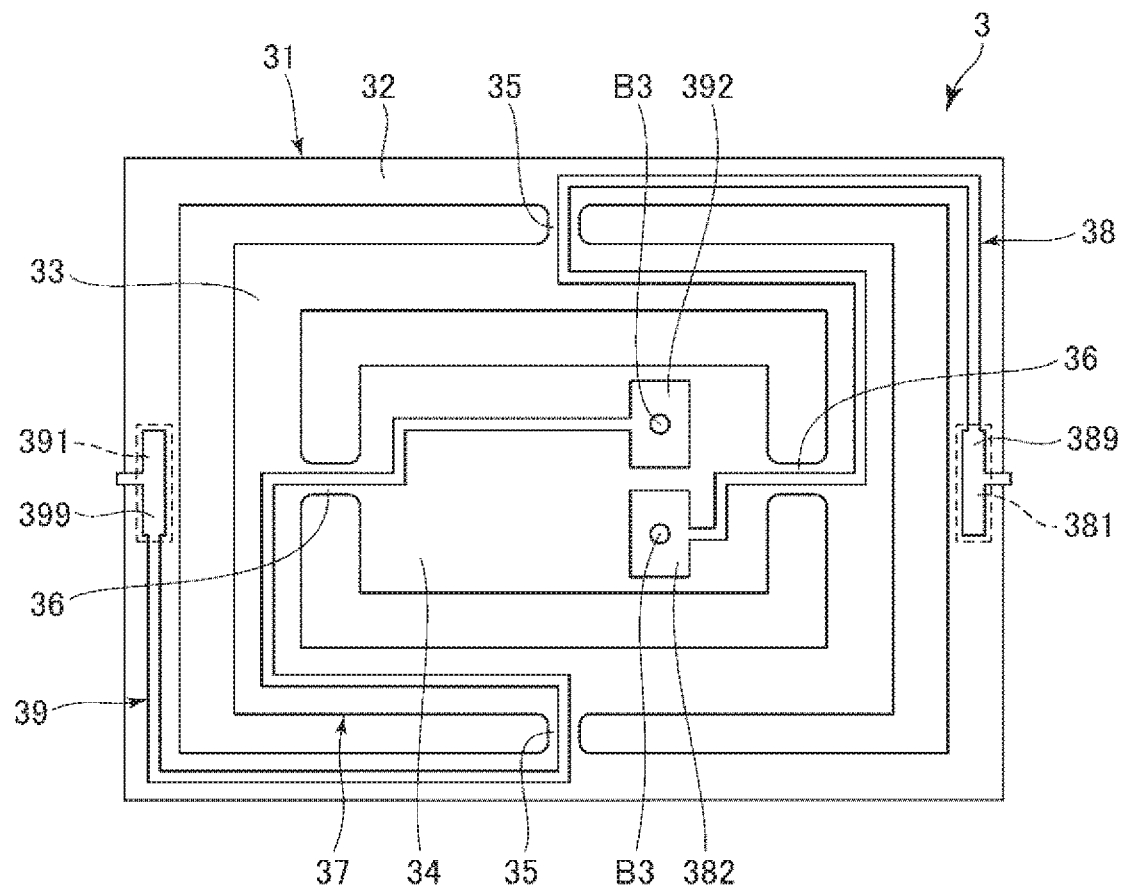
FIG. 4 is a bottom view illustrating the relay substrate.
Figure 5:
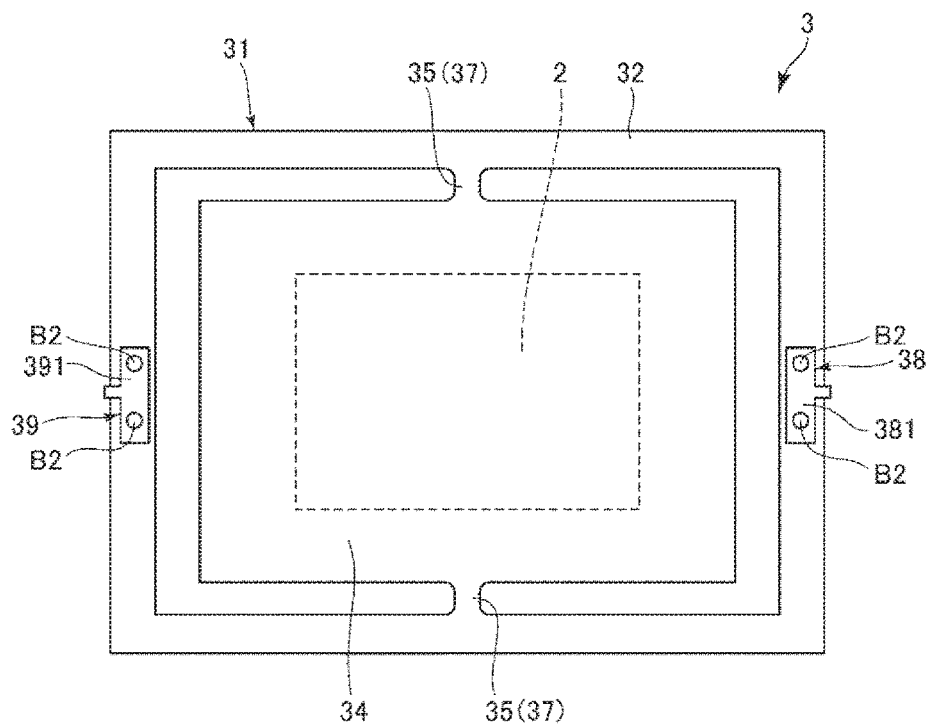
FIG. 5 is a top view illustrating a modification example of the relay substrate.
Figure 6:
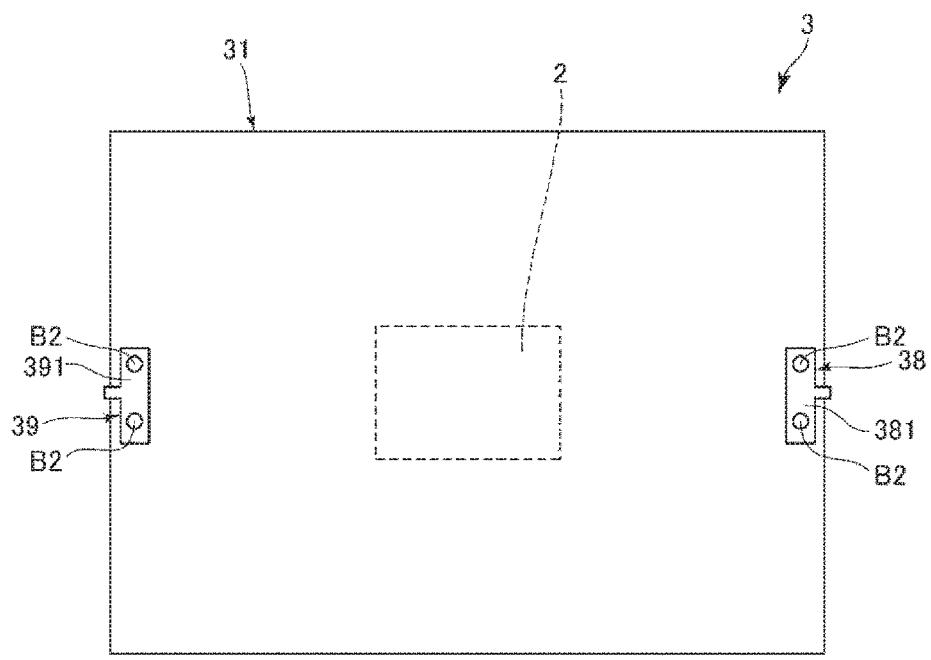
FIG. 6 is a top view illustrating the modification example of the relay substrate.
Figure 7:
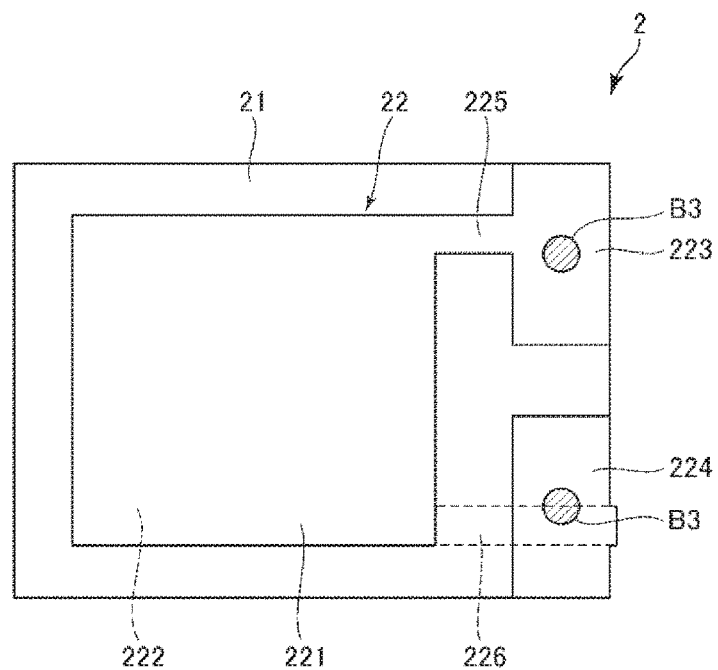
FIG. 7 is a top view illustrating a vibrator element.
Figure 8:
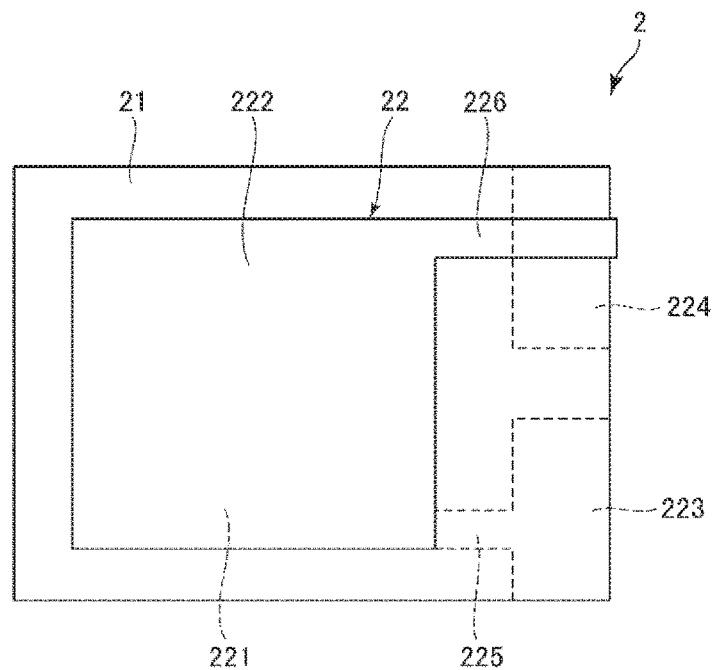
FIG. 8 is a bottom view illustrating the vibrator element.
Figure 9:
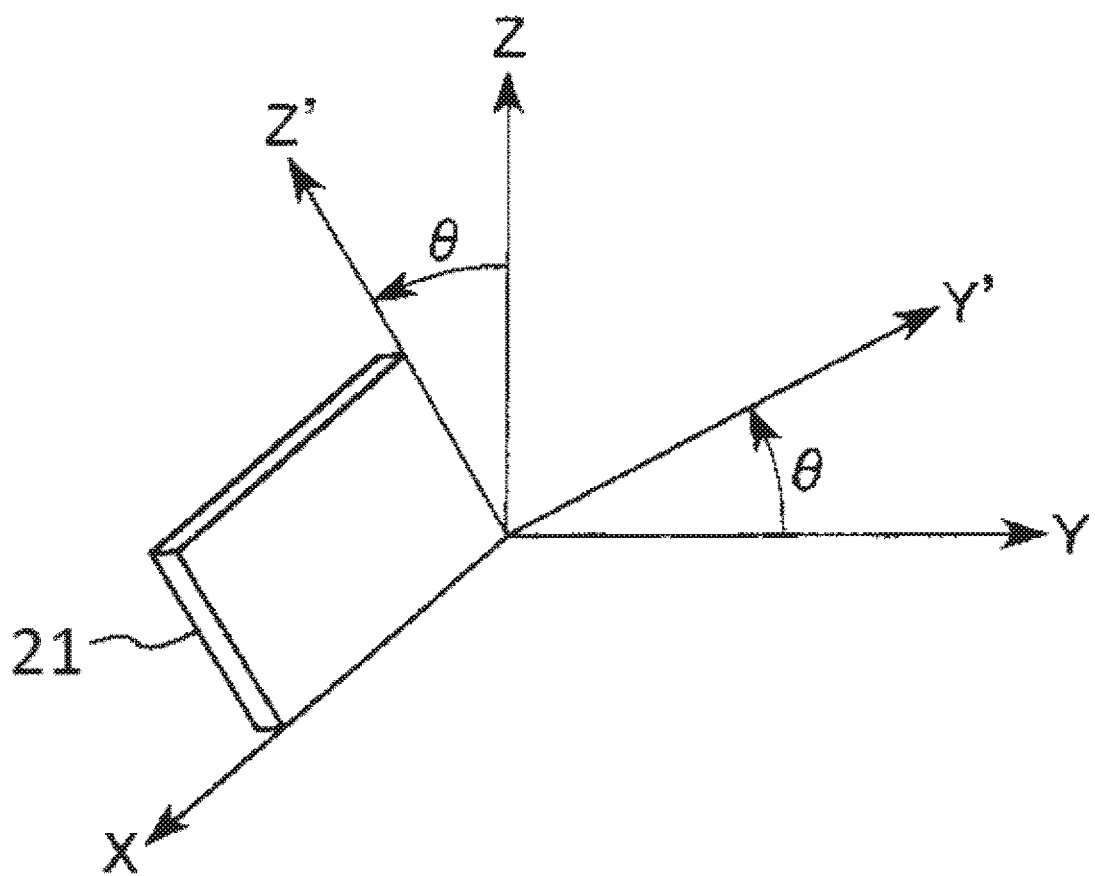
FIG. 9 is a view for describing a cut angle of quartz crystal.
Figure 10:
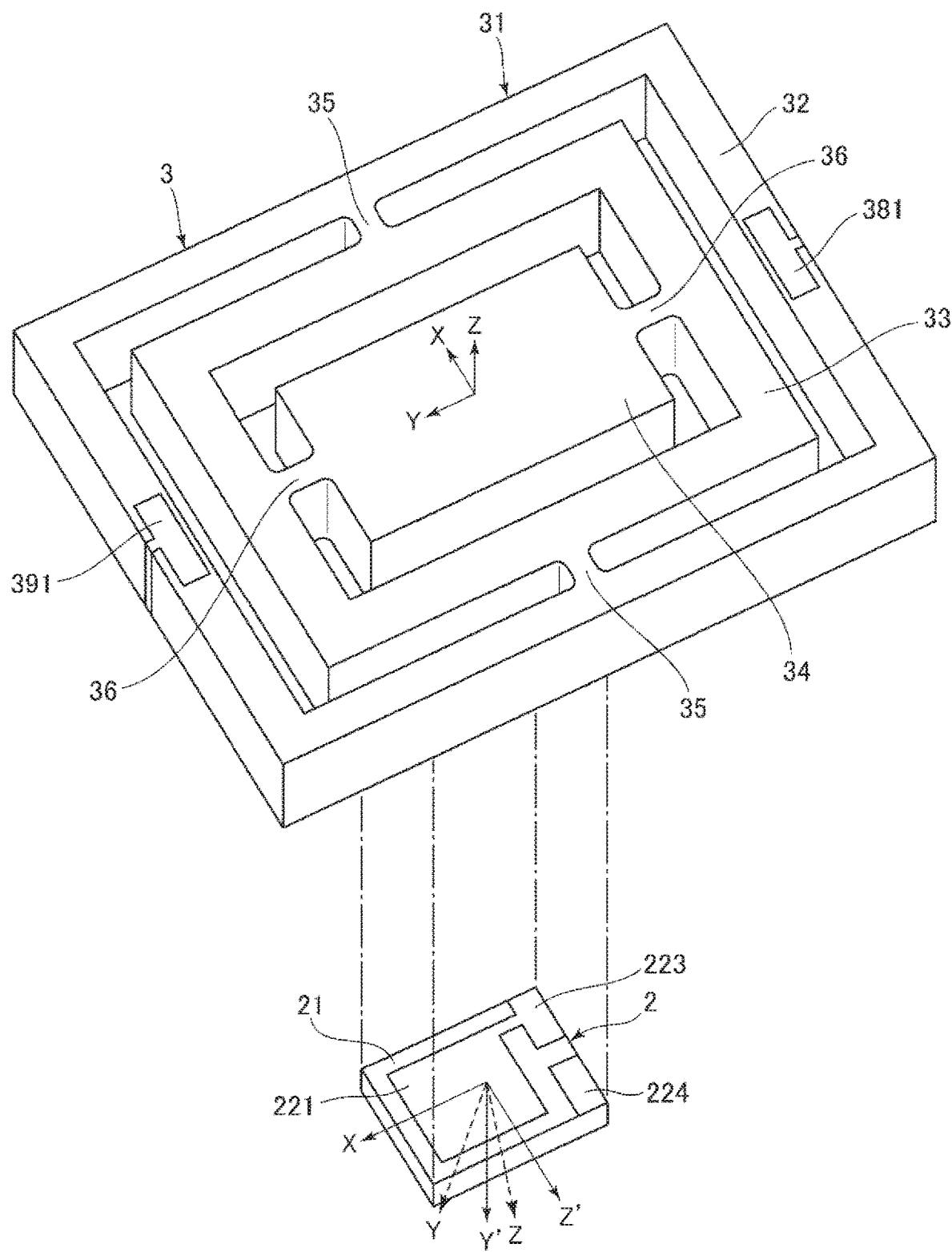
FIG. 10 is a perspective view illustrating a relationship between the relay substrate and crystal axes of the vibrator element.
Figure 11:
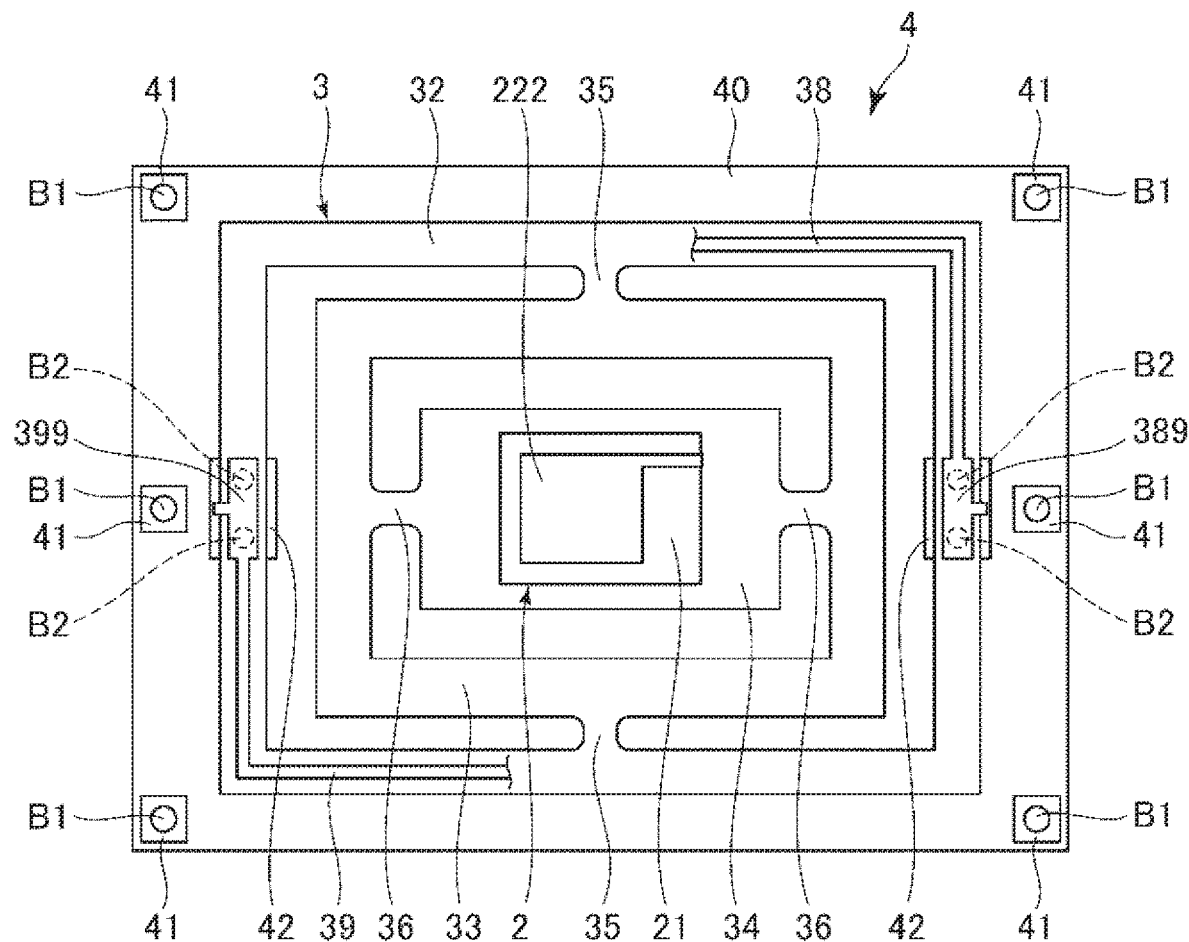
FIG. 11 is a bottom view illustrating a laminated structure.
Figure 12:
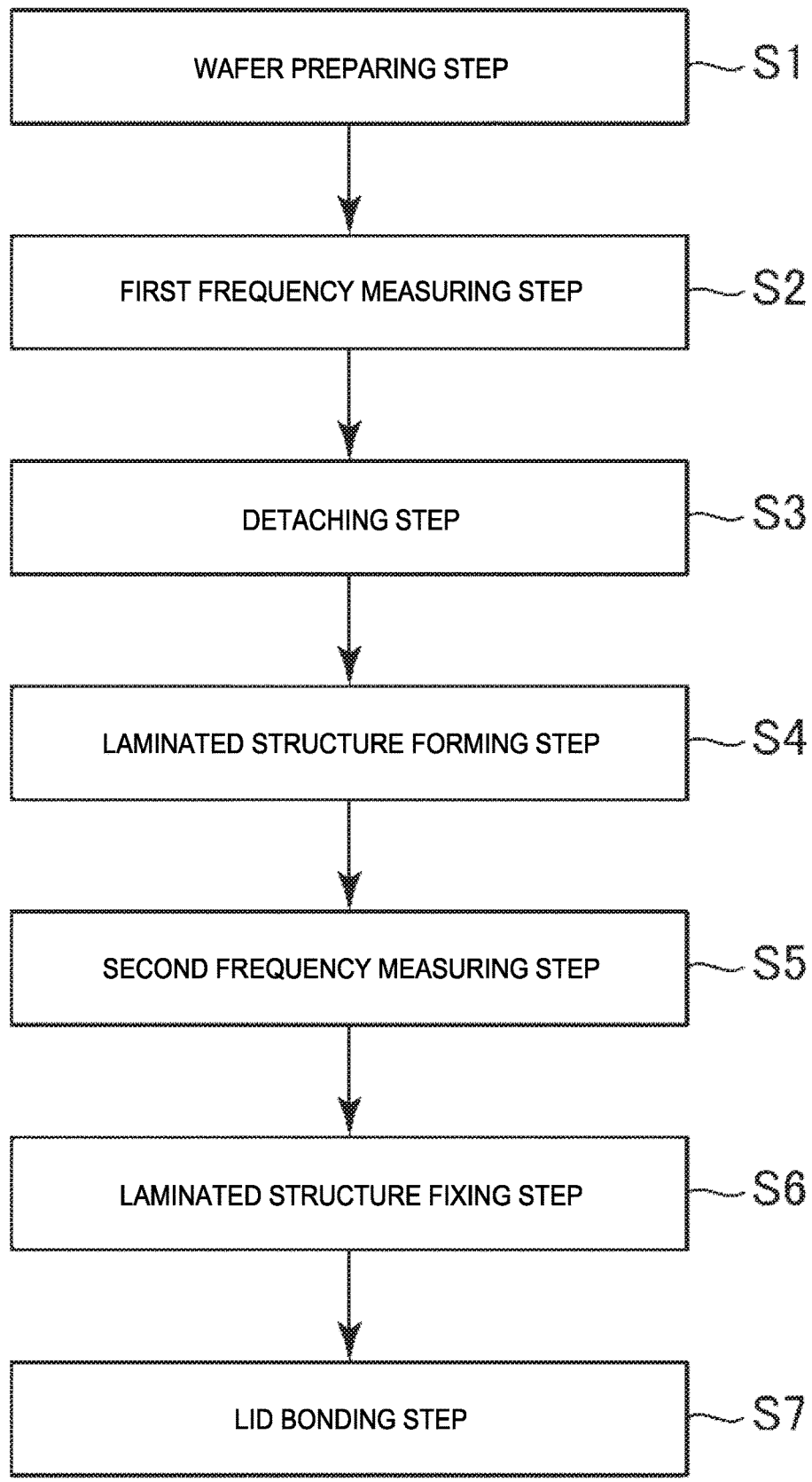
FIG. 12 is a flowchart illustrating manufacturing steps of the vibrator device illustrated in FIG. 1.
Figure 13:
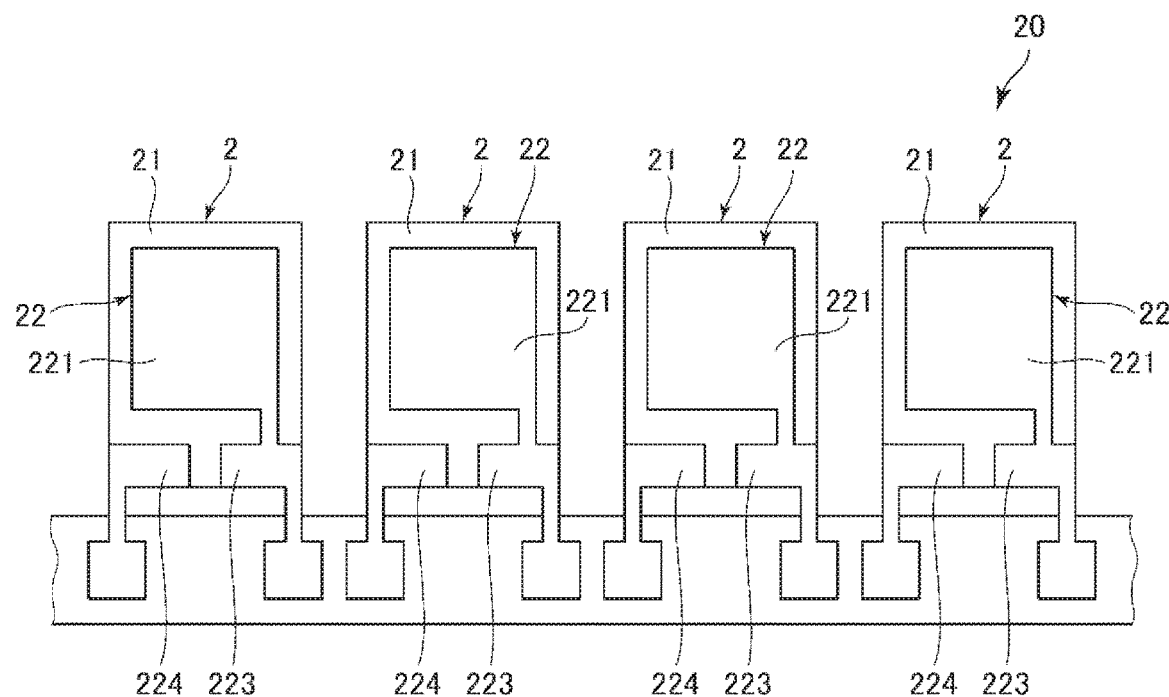
FIG. 13 is a plan view for describing a method of manufacturing a vibrator device.
Figure 14:
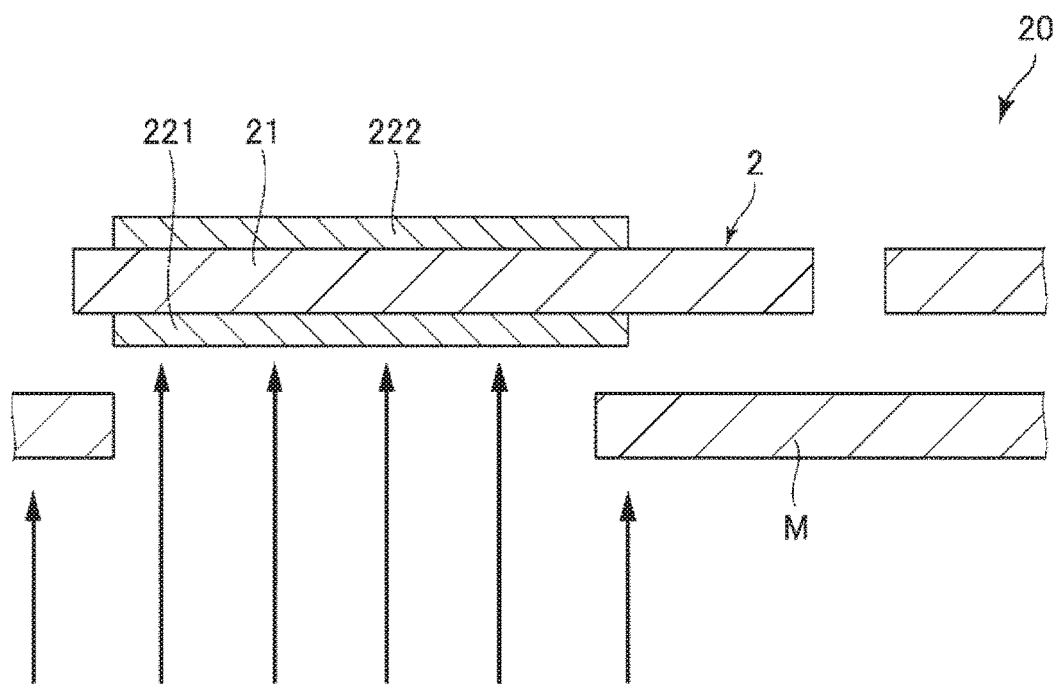
FIG. 14 is a cross-sectional view for describing the method of manufacturing a vibrator device.
Figure 15:
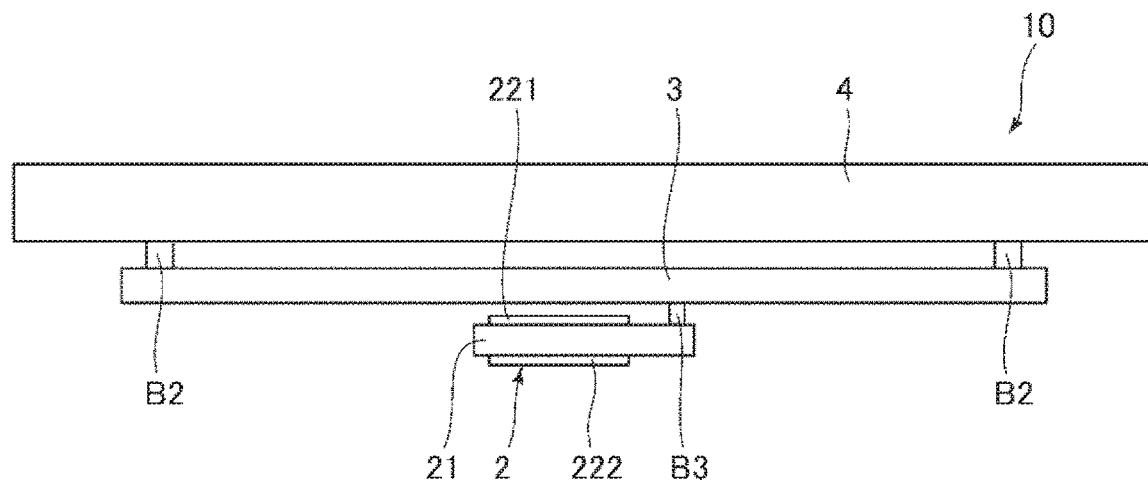
FIG. 15 is a side view for describing the method of manufacturing a vibrator device.
Figure 16:
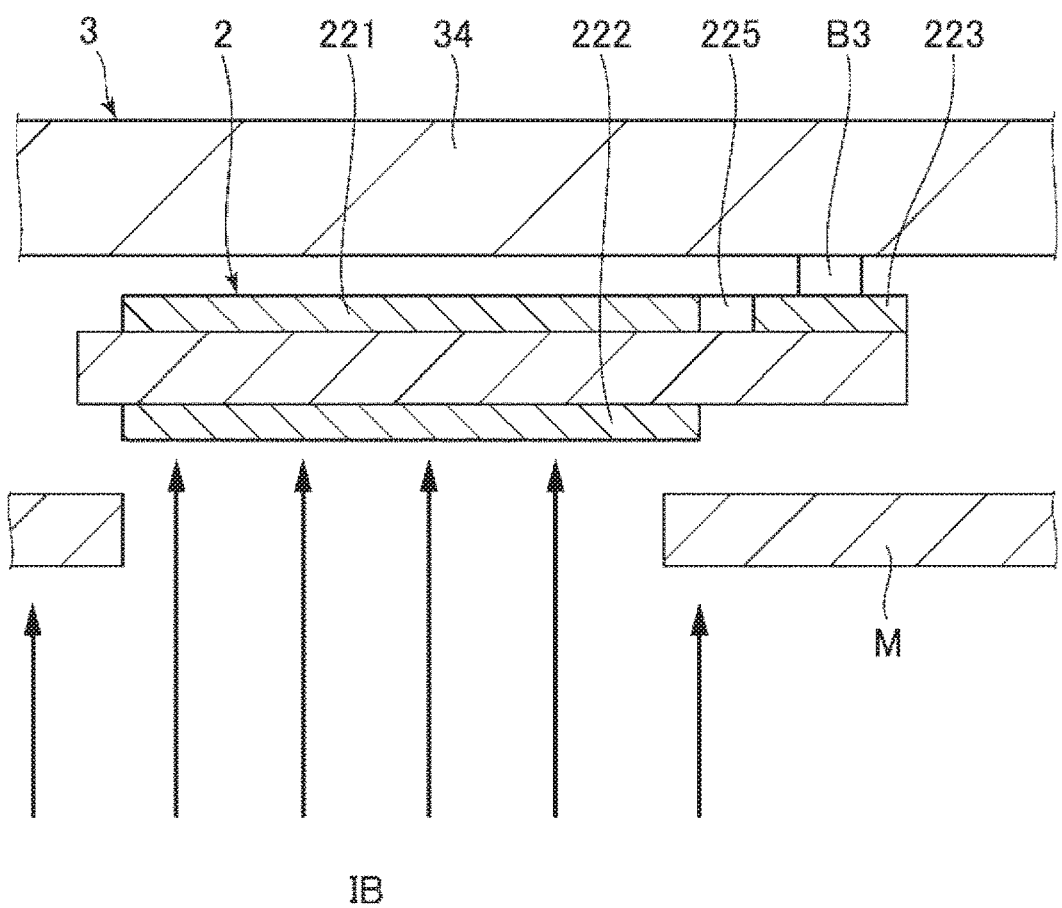
FIG. 16 is a cross-sectional view for describing the method of manufacturing a vibrator device.
Figure 17:
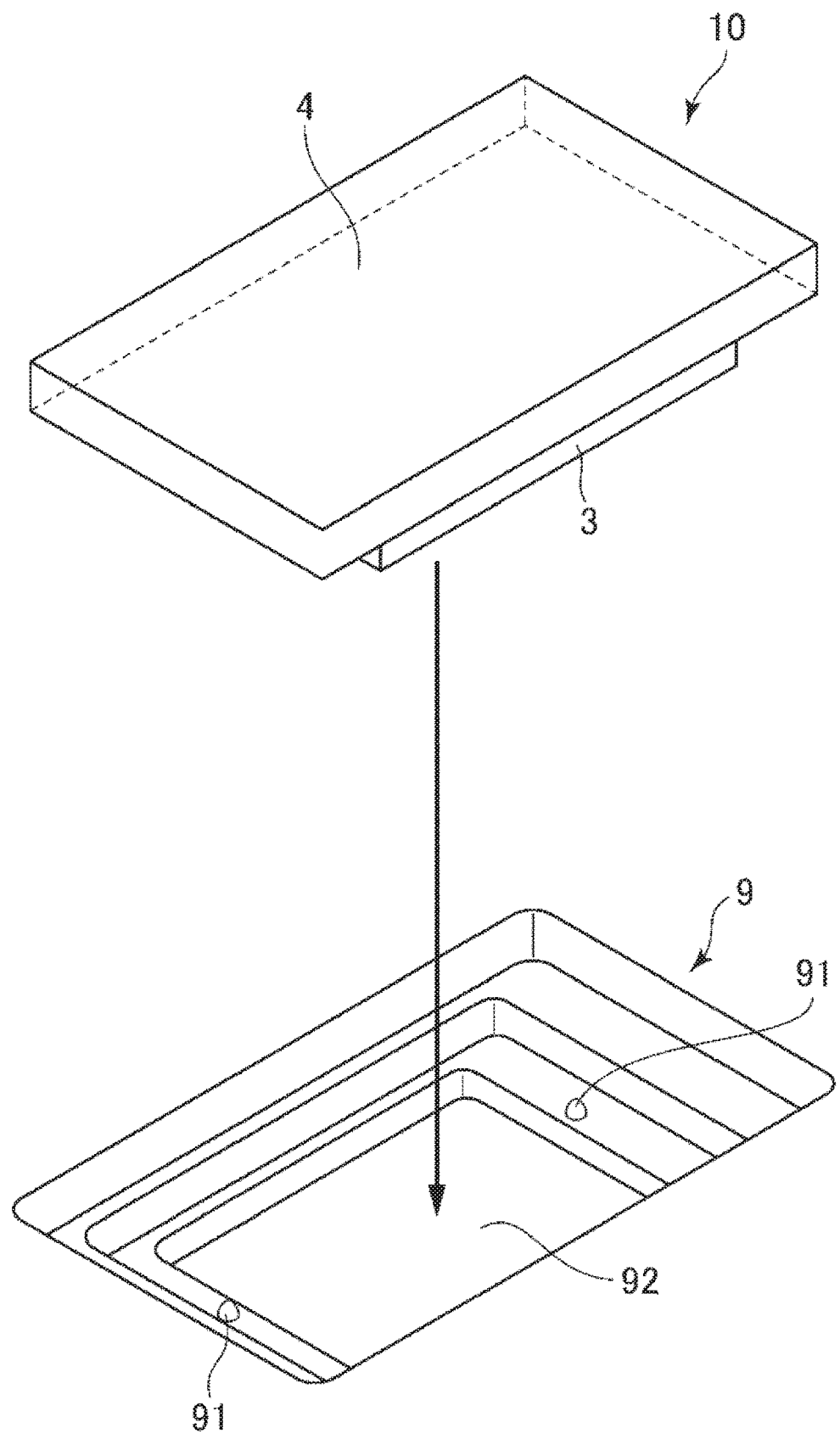
FIG. 17 is a perspective view illustrating a jig used for manufacturing the vibrator device.
Figure 18:
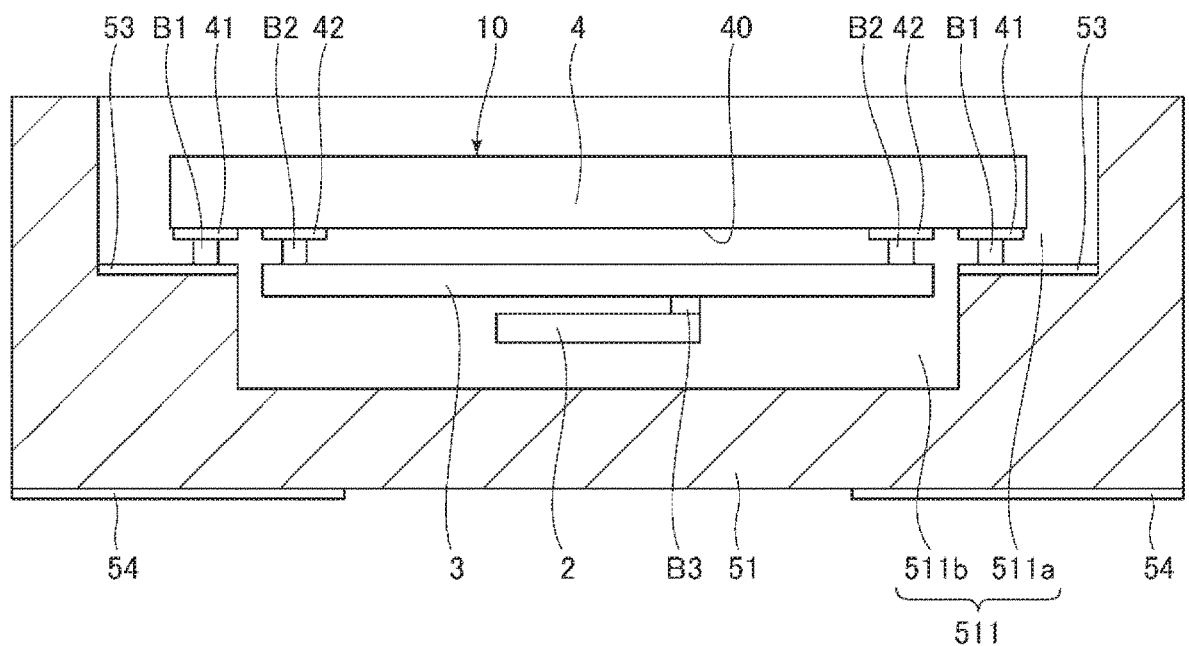
FIG. 18 is a cross-sectional view for describing the method of manufacturing a vibrator device.
Figure 19:
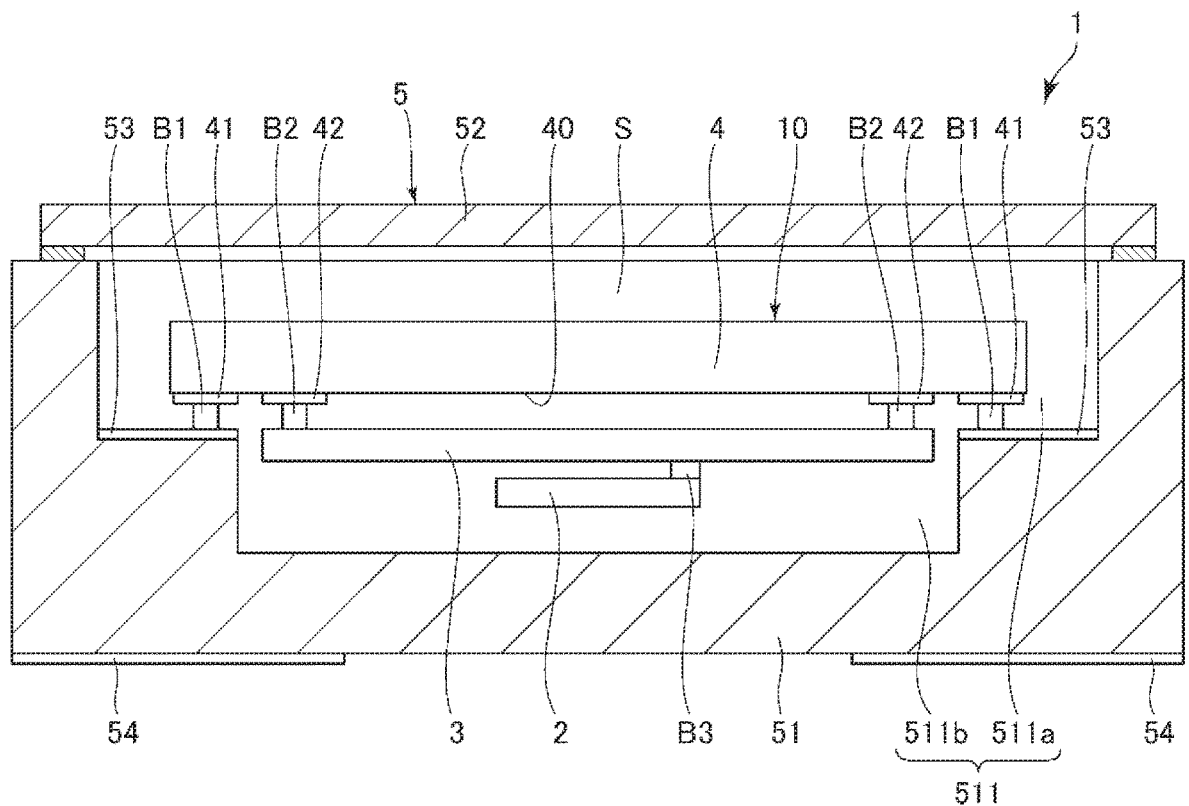
FIG. 19 is a cross-sectional view for describing the method of manufacturing a vibrator device.

FIG. 1 is a cross-sectional view illustrating a vibrator device according to a first embodiment of the invention. FIG. 2 is a top view illustrating the vibrator device of FIG. 1 in a case where a lid is removed. FIG. 3 is a top view illustrating a relay substrate. FIG. 4 is a bottom view illustrating the relay substrate. FIGS. 5 and 6 are top views illustrating a modification example of the relay substrate, respectively. FIG. 7 is a top view illustrating a vibrator element. FIG. 8 is a bottom view illustrating the vibrator element. FIG. 9 is a view for describing a cut angle of quartz crystal. FIG. 10 is a perspective view illustrating a relationship between the relay substrate and crystal axes of the vibrator element. FIG. 11 is a bottom view illustrating a laminated structure. FIG. 12 is a flowchart illustrating manufacturing steps of the vibrator device illustrated in FIG. 1. FIG. 13 is a plan view for describing a method of manufacturing a vibrator device. FIGS. 14 to 16 are cross-sectional views for describing the method of manufacturing a vibrator device, respectively. FIG. 17 is a perspective view illustrating a jig used for manufacturing the vibrator device. FIGS. 18 and 19 are cross-sectional views for describing the method of manufacturing a vibrator device, respectively. Hereinafter, for convenience of description, an upper side in FIG. 1 is also referred to as "above" and a lower side is also referred to as "below". In addition, the crystal axes of quartz crystal will be described as X axis (electrical axis), Y axis (mechanical axis), and Z axis (optical axis). In addition, hereinafter, a plan view viewed from a vertical direction in FIG. 1 is simply referred to as "plan view".

As illustrated in FIGS. 1 and 2, the vibrator device 1 includes a vibrator element 2, a second relay substrate 3, a first relay substrate 4, and a package 5 that stores these. Here, when mounting the vibrator element 2 and the second relay substrate 3 on the package 5, since the first relay substrate 4 is intended to reduce the mounting stress applied to the vibrator element 2, the first relay substrate 4 may be an insulating substrate on which wiring electrodes are disposed, for example, a silicon single plate or a silicon laminated substrate. In the embodiment, as the first relay substrate 4, a circuit element having a drive circuit for the vibrator element 2 is used. Since the circuit element is formed of a silicon substrate, a function as the first relay substrate 4 of the embodiment can be sufficiently fulfilled. Hereinafter, for convenience of description, the first relay substrate 4 is also referred to as "circuit element 4" and the second relay substrate 3 is also referred to as "relay substrate 3".

In the package 5, the relay substrate 3 is positioned below the circuit element 4, the vibrator element 2 is positioned below the relay substrate 3, and the circuit element 4, the relay substrate 3, and the vibrator element 2 are disposed so as to overlap each other in a thickness direction (vertical direction) of the package 5. In this manner, the circuit element 4, the relay substrate 3, and the vibrator element 2 are disposed so as to overlap each other. Accordingly, a planar spread of the vibrator device 1 can be suppressed and a size of the vibrator device 1 can be reduced. In addition, the vibrator element 2 is mounted on the relay substrate 3, the relay substrate 3 is mounted on the circuit element 4, and the circuit element 4 is mounted on the package 5. In this manner, the relay substrate 3 is interposed between the package 5, the circuit element 4, and the vibrator element 2. Accordingly, for example, deformation (stress) due to thermal deflection or the like of the package 5 or the circuit element 4 is hard to be transmitted to the vibrator element 2, and it is possible to suppress deterioration (variation) of vibration characteristics of the vibrator element 2. Hereinafter, a laminate of the circuit element 4, the relay substrate 3, and the vibrator element 2 is also referred to as a laminated structure 10. Each part of the vibrator device 1 will be described in detail below.

Package

As illustrated in FIG. 1, the package 5 has a storage space S inside, and the vibrator element 2, the relay substrate 3, and the circuit element 4 are stored in the storage space S. Therefore, the package 5 can suitably protect the vibrator element 2, the relay substrate 3, and the circuit element 4 from impact, dust, heat, moisture, and the like. Such a package 5 includes a base 51 for mounting the vibrator element 2, the relay substrate 3, and the circuit element 4, and a lid 52 (lid body) bonded to the upper surface of the base 51 so as to form the storage space S between the lid 52 and the base 51.

The base 51 is in the form of a cavity having a recessed portion 511 opening on the upper surface thereof. In addition, the recessed portion 511 includes a first recessed portion 511a opening on the upper surface of the base 51 and a second recessed portion 511b opening to the bottom of the first recessed portion 511a. On the other hand, the lid 52 is plate-shaped and is bonded to the upper surface of the base 51 so as to close the opening of the recessed portion 511. In this manner, the storage space S is formed by closing the opening of the recessed portion 511 with the lid 52, and the vibrator element 2, the relay substrate 3, and the circuit element 4 are stored in the storage space S. The storage space S is air-tightly sealed, and is in a reduced pressure state (preferably more nearly vacuum state). As a result, the vibrator element 2 can be stably driven. However, the atmosphere in the storage space S is not particularly limited, and may be, for example, atmospheric pressure.

The constituent material of the base 51 is not particularly limited, and, for example, various ceramics such as aluminum oxide can be used. In this case, the base 51 can be manufactured by firing the laminate of the ceramic sheets (green sheets). On the other hand, the constituent material of the lid 52 is not particularly limited, and the lid 52 may be a member having a linear expansion coefficient close to that of the constituent material of the base 51. For example, in a case where the constituent material of the base 51 is ceramics as described above, it is preferable to use an alloy such as kovar.

In addition, the base 51 includes a plurality of internal terminals 53 disposed on the bottom surface of the first recessed portion 511a and a plurality of external terminals 54 disposed on the bottom surface of the base 51. Each of the plurality of internal terminals 53 is electrically coupled to a predetermined external terminal 54 through internal wiring (not illustrated) formed inside the base 51. In addition, each of the plurality of internal terminals 53 is electrically coupled to the circuit element 4 through a conductive connection bump B1.

Circuit Element

The circuit element 4 is, for example, a semiconductor circuit substrate in which various circuit elements are formed on the silicon substrate, and as illustrated in FIG. 1, the circuit element 4 is disposed in the package 5 with an active surface 40 facing downward. The circuit element 4 is fixed to the upper surface of the first recessed portion 511a of the package 5 through the conductive connection bump B1. In addition, the circuit element 4 includes a plurality of terminals 41 and 42 arranged on the active surface 40. Among these, each of the plurality of terminals 41 is electrically coupled to a predetermined internal terminal 53 through the connection bump B1. Such a circuit element 4 includes, for example, a drive circuit 49 (oscillation circuit for rocking) for driving the vibrator element 2.

The connection bumps B1 are not particularly limited as long as the connection bump has conductivity and bonding characteristics, and it is preferable to use various metal bumps such as a gold bump, a silver bump, or a copper bump. As a result, outgas from the connection bumps B1 is prevented, and environmental changes (especially increase in pressure) in the storage space S can be effectively suppressed.

A bonding portion (that is, the plurality of terminals 41) to be mounted on the base 51 of the circuit element 4 is disposed in a region not overlapping the relay substrate 3 or the vibrator element 2 in a plan view (in a plan view from normal direction of circuit element 4). As a result, the stress caused by deformation of the package 5 is unlikely to be transmitted to the relay substrate 3 or the vibrator element 2. Therefore, the mounting stress applied to the relay substrate 3 and the vibrator element 2 is reduced, and frequency variation of the vibrator element 2 is suppressed.

Relay Substrate

As illustrated in FIG. 1, the relay substrate 3 is interposed between the circuit element 4 and the vibrator element 2. The relay substrate 3 mainly has a function of making it difficult for the stress caused by deformation of the package 5 or the circuit element 4 to be transmitted to the vibrator element 2.

As illustrated in FIGS. 3 and 4, the relay substrate 3 includes a substrate 31 and a pair of wirings 38 and 39 disposed on the substrate 31. The substrate 31 has a gimbal shape. Specifically, the substrate 31 includes a frame-shaped support portion 32 (first portion) fixed to the circuit element 4, a frame-shaped first rocking portion 33 (third portion) positioned inside the support portion 32, a second rocking portion 34 (second portion) positioned inside the first rocking portion 33 and to which the vibrator element 2 is fixed, a pair of beam portions 35 (first beam portions) connecting the support portion 32 and the first rocking portion 33, and a pair of beam portions 36 (second beam portions) connecting the first rocking portion 33 and the second rocking portion 34. Among these parts, the first rocking portion 33 and the beam portions 35 and 36, which are portions positioned between the support portion 32 and the second rocking portion 34, form a connection portion 37 connecting the support portion 32 and the second rocking portion 34.

The support portion 32 has a rectangular frame shape and includes four edge portions 321, 322, 323, and 324. The support portion 32 is fixed to the active surface 40 of the circuit element 4 through the two connection bumps B2 at the center portion in the extending direction of the edge portions 321 and 322 opposed to each other (positioned on side opposite to center O), respectively. In this manner, both sides of the support portion 32 are fixed to the circuit element 4. Accordingly, a posture of the relay substrate 3 is stabilized, and unnecessary displacement, vibration, or the like of the relay substrate 3 can be suppressed. However, the number and arrangement of the connection bumps B2 are not particularly limited, and, for example, may be disposed at each corner portion of the support portion 32, or may be disposed only on one side with respect to the center O.

The connection bumps B2 are not particularly limited as long as the connection bump has conductivity and bonding characteristics, and it is preferable to use various metal bumps such as a gold bump, a silver bump, or a copper bump. As a result, outgas from the connection bumps B2 is prevented, and environmental changes (especially increase in pressure) in the storage space S can be effectively suppressed.

In addition, the first rocking portion 33 positioned inside the support portion 32 has a rectangular frame shape and includes four edge portions 331, 332, 333, and 334. In addition, the second rocking portion 34 positioned inside the first rocking portion 33 has a rectangular plate shape (single plate shape) and includes four edge portions 341, 342, 343, and 344. The vibrator element 2 is fixed to the lower surface of the second rocking portion 34 through a connecting bump B3 having conductivity.

In addition, the pair of beam portions 35 are positioned on both sides of the first rocking portion 33, and connect the first rocking portion 33 and the support portion 32 so as to support the first rocking portion 33 at both ends. Specifically, one beam portion 35 connects the center portions in the extending direction of the edge portions 323 and 333, and the other beam portion 35 connects the center portions in the extending direction of the edge portions 324 and 334. Therefore, the first rocking portion 33 is capable of rocking around a first axis L1 (line segment connecting the pair of beam portions 35) formed by the pair of beam portions 35 with respect to the support portion 32.

In addition, the pair of beam portions 36 are positioned on both sides of the second rocking portion 34, and connect the second rocking portion 34 and the first rocking portion 33 so as to support the second rocking portion 34 at both ends. Specifically, one beam portion 36 connects the center portions in the extending direction of the edge portions 331 and 341, and the other beam portion 36 connects the center portions in the extending direction of the edge portions 332 and 342. Therefore, the second rocking portion 34 is formed by the pair of beam portions 36 with respect to the first rocking portion 33 and is capable of rocking around a second axis L2 intersecting with the first axis L1 (line segment connecting the pair of beam portions 36).

According to the substrate 31 having such a configuration, since it is possible to cause a stress transmission path to meander from the support portion 32 fixed to the circuit element 4 to the second rocking portion 34 to which the vibrator element 2 is fixed, it is possible to secure the transmission path longer. Therefore, the stress caused by the deformation of the package 5 and the circuit element 4 is effectively absorbed or relaxed between the support portion 32 and the second rocking portion 34, and it is possible to effectively suppress the stress from being transmitted to the vibrator element 2 on the second rocking portion 34. Therefore, a change in the driving characteristics of the vibrator element 2 (especially variation of vibration frequency) hardly occurs, and the vibrator element 2 can exhibit excellent vibration characteristics.

In particular, in the embodiment, the first axis L1 and the second axis L2 are orthogonal to each other in the plan view of the relay substrate 3. Furthermore, the intersection point of the first axis L1 and the second axis L2 coincides with the center O of the substrate 31. As a result, the first rocking portion 33 is supported in a well-balanced manner on the support portion 32, and the second rocking portion 34 is supported in a well-balanced manner on the first rocking portion 33. As a result, it is possible to effectively suppress the rocking of the vibrator element 2 fixed to the second rocking portion 34.

Such a substrate 31 is formed by patterning a quartz crystal substrate by etching (particularly wet etching). In the embodiment, the substrate 31 is formed of a Z-cut quartz crystal substrate, and the normal lines of both principal planes of the substrate 31 coincide with the Z axis (optical axis) as the crystal axis of the quartz crystal. Since the Z axis (optical axis) preferentially etches compared with the X axis (electrical axis) and the Y axis (mechanical axis), which are the other crystal axes of the quartz crystal, by forming the substrate 31 from the Z-cut quartz crystal substrate, the etching time can be shortened. In addition, since the etched surface (side surface formed by etching) is steeper, it is possible to form the relay substrate 3 with excellent dimensional accuracy. In the embodiment, the first axis L1 is parallel to the X axis and the second axis L2 is parallel to the Y axis, and the invention is not limited thereto.

By forming the substrate 31 from the quartz crystal substrate in this manner, the substrate 31 can be made of the same material as a vibrator substrate 21 of the vibrator element 2. Therefore, the thermal expansion coefficients of the substrate 31 and the vibrator substrate 21 are equal to each other, and stress is hardly generated in the vibrator element 2. However, the substrate 31 is not particularly limited, and may be formed of a quartz substrate other than the Z-cut quartz substrate, such as an X-cut quartz substrate, a Y-cut quartz substrate, an AT cut quartz substrate, a BT cut quartz substrate, an SC cut quartz substrate, or an ST cut quartz substrate. In addition, the substrate 31 is not limited to a substrate formed of the quartz crystal substrate, and may be formed of, for example, a piezoelectric substrate, a silicon substrate, a resin substrate, a metal substrate, a ceramic substrate, or the like, other than the quartz crystal.

The wiring 38 is mainly routed from the support portion 32 of the substrate 31 to the second rocking portion 34, one end portion of the wiring 38 serves as a terminal 381 positioned on the support portion 32, and the other end serves as a terminal 382 positioned on the second rocking portion 34. In addition, the wiring 38 includes a terminal 389 positioned in the middle thereof. Similarly, the wiring 39 is mainly routed from the support portion 32 of the substrate 31 to the second rocking portion 34, one end portion of the wiring 38 serves as a terminal 391 positioned on the support portion 32, and the other end serves as a terminal 392 positioned on the second rocking portion 34. In addition, the wiring 39 includes a terminal 399 positioned in the middle thereof. The terminals 381 and 391 are positioned on the upper surface of the substrate 31, and are electrically coupled to the terminals 42 of the circuit element 4 respectively through the connection bumps B2. On the other hand, each of the terminals 382 and 392 is positioned on the lower surface of the substrate 31, and is electrically coupled to the vibrator element 2 through the conductive connection bump B3. In this manner, the relay substrate 3 includes the wirings 38 and 39, so that the electrical connection between the vibrator element 2 and the circuit element 4 is facilitated. The terminals 389 and 399 are terminals used for frequency measurement of the vibrator element 2, which will be described later in detail.

Hereinbefore, although the relay substrate 3 is described, the configuration of the relay substrate 3 is not limited to the above configuration. For example, as illustrated in FIG. 5, in the substrate 31, the first rocking portion 33 and the beam portion 36 may be omitted, and the second rocking portion 34 may be coupled to the support portion 32 through the beam portion 35. That is, the connection portion 37 may be configured to include the beam portion 35. Even with such a configuration, it is possible to ensure the transmission path of the stress as long as possible. Therefore, the stress caused by the deformation of the package 5 and the circuit element 4 is effectively absorbed or relaxed between the support portion 32 and the second rocking portion 34, and it is possible to effectively suppress the stress from being transmitted to the vibrator element 2 on the second rocking portion 34.

In addition, as illustrated in FIG. 6, the substrate 31 may have a single plate shape rather than a gimbal shape. In addition, although each of the support portion 32 and the first rocking portion 33 has a ring shape, a portion thereof in the circumferential direction may be missing. In addition, the first and second axes L1 and L2 may not be orthogonal to each other (that is, first and second axes may intersect at an angle other than 90°), and the intersection of the first and second axes L1 and L2 may not coincide with the center O of the substrate 31. In addition, one of the pair of beam portions 35 may be omitted, or one of the pair of beam portions 36 may be omitted. In addition, in the embodiment, although the first rocking portion 33 is able to rock with respect to the support portion 32, and the second rocking portion 34 is able to rock with respect to the first rocking portion 33, the invention is not limited thereto. For example, the beam portion 35 is hard, and the first rocking portion 33 may not substantially be able to rock with respect to the support portion 32, and the beam portion 36 is hard and the second rocking portion 34 may not substantially be able to rock with respect to the first rocking portion 33.

Vibrator Element

As illustrated in FIGS. 7 and 8, the vibrator element 2 includes a vibrator substrate 21 and an electrode 22 disposed on the vibrator substrate 21. In addition, the vibrator substrate 21 is made of a piezoelectric material, and in particular, the vibrator substrate 21 is made of quartz crystal in the embodiment. As a result, it is possible to obtain the vibrator element 2 having excellent frequency temperature characteristics as compared with other piezoelectric materials. The piezoelectric material is not limited to quartz crystal, and may be lithium niobate ($LiNbO_3$), lithium tantalate ($LiTaO_3$), lead zirconate titanate (PZT), lithium tetraborate ($Li_2B_4O_7$), langasite ($La_3Ga_5SiO_{14}$), potassium niobate ($KNbO_3$), gallium phosphate ($GaPO_4$), gallium arsenide (GaAs), aluminum nitride (AlN), zinc oxide (ZnO, $Zn_2O_3$), barium titanate ($BaTiO_3$), lead titanate ($PbPO_3$), sodium potassium niobate ($(K,Na)NbO_3$), bismuth ferrite ($BiFeO_3$), sodium niobate ($NaNbO_3$), bismuth titanate ($Bi_4Ti_3O_{12}$)), bismuth sodium titanate ($Na_{0.5}Bi_{0.5}TiO_3$), or the like.

The vibrator substrate 21 has a thickness shear vibration mode, and is formed of an AT cut quartz crystal substrate in the embodiment. As illustrated in FIG. 9, the AT cut quartz crystal substrate is a "rotated Y-cut quartz crystal substrate" cut along a plane obtained by rotating the XZ plane around the X axis at an angle $\theta$ (=35°15'). Since the AT cut quartz crystal substrate has a third-order frequency temperature characteristics, by forming the vibrator substrate 21 from the AT cut quartz crystal substrate, the vibrator element 2 having excellent temperature characteristics is obtained. Hereinafter, the Y axis and the Z axis rotated around the X axis corresponding to the angle $\theta$ are referred to as the Y' axis and the Z' axis. That is, the vibrator substrate 21 has a thickness in the Y' axis direction and has a spread in the XZ' plane direction.

The electrode 22 includes an excitation electrode 221 disposed on the upper surface of the vibrator substrate 21 and an excitation electrode 222 disposed on the lower surface so as to face the excitation electrode 221. In addition, the electrode 22 includes a pair of terminals 223 and 224 disposed on the upper surface of the vibrator substrate 21, a wiring 225 for electrically connecting the terminal 223 and the excitation electrode 221, and a wiring 226 for electrically connecting the terminal 224 and the excitation electrode 222. By applying a drive signal (alternating voltage) between the excitation electrodes 221 and 222, the vibrator substrate 21 undergoes thickness shear vibration.

Such a vibrator element 2 is fixed to the second rocking portion 34 of the relay substrate 3 through a pair of conductive connection bumps B3. In addition, the terminal 223 of the vibrator element 2 and the terminal 382 of the relay substrate 3 are electrically coupled through one of the connection bumps B3, and the terminal 224 of the vibrator element 2 and the terminal 392 of the relay substrate 3 are electrically coupled through the other connection bump B3. Therefore, the vibrator element 2 is electrically coupled to the circuit element 4 through the wirings 38 and 39 of the relay substrate 3.

Hereinbefore, although the vibrator element 2 is described, the configuration of the vibrator element 2 is not limited to the above configuration. For example, the vibrator element 2 may be a mesa type in which a vibration region of the vibrator substrate 21 (region interposed between excitation electrodes 221 and 222) protrudes from the periphery thereof, or on the contrary, the vibrator element 2 may be an inverted mesa type in which the vibration region is recessed from the periphery thereof. In addition, bevel processing for grinding the periphery of the vibrator substrate 21 or convex processing with projection curved surfaces on the upper and lower surfaces may be applied. In addition, the vibrator element 2 is not limited to an element which vibrates in the thickness shear vibration mode, and for example, may be a vibrator element 2 in which a plurality of vibrating arms perform flexural vibration (tuning folk vibration) in the in-plane direction, or may be a vibrator element 2 in which a plurality of vibrating arms perform flexural vibration (walk vibration) in the out-of-plane direction.

As described above, although the substrate 31 of the relay substrate 3 and the vibrator substrate 21 of the vibrator element 2 are both made of quartz crystal, and in the vibrator device 1, as illustrated in FIG. 10, the crystal axis of the substrate 31 and the crystal axis of the vibrator substrate 21 are shifted from each other. That is, the X axis of the substrate 31 extends in a direction different from the X axis of the vibrator substrate 21, the Y axis of the substrate 31 extends in a direction different from the Y axis of the vibrator substrate 21, and the Z axis of the substrate 31 extends in a direction different from the Z axis of the vibrator substrate 21. As a result, it is possible to separate the mechanical vibration points (vibration frequencies) between the vibrator substrate 21 and the substrate 31, as compared with, for example, a case where the crystal axes of the vibrator substrate 21 and the substrate 31 coincide with each other. Therefore, occurrence of unintentional vibration on the relay substrate 3 so as to vibrate with the vibration of the vibrator element 2 can be suppressed, and it is possible to effectively suppress the deterioration of the vibration characteristics of the vibrator element 2 due to the vibration of the relay substrate 3.

In particular, in the embodiment, the X axis of the substrate 31 is inclined around both the Y axis and the Z axis with respect to the X axis of the vibrator substrate 21. The Y axis of the substrate 31 is inclined around both the X axis and the Z axis with respect to the Y axis of the vibrator substrate 21. The Z axis of the substrate 31 is inclined around both the X axis and the Y axis with respect to the Z axis of the vibrator substrate 21. That is, the crystal axis of the substrate 31 and the crystal axis of the vibrator substrate are in a twisted relationship. Therefore, the above-described effect becomes more remarkable, and the mechanical vibration points (vibration frequencies) between the vibrator substrate 21 and the substrate 31 can be further separated from each other. Therefore, occurrence of unintentional vibration on the relay substrate 3 so as to vibrate with the vibration of the vibrator element 2 can be effectively suppressed, and it is possible to effectively suppress the deterioration of the vibration characteristics of the vibrator element 2 due to the vibration of the relay substrate 3.

The relationship between the crystal axes of the substrate 31 and the vibrator substrate 21 is not particularly limited, and for example, if two axes of the X axis, the Y axis, and the Z axis of the substrate 31 are inclined with respect to the corresponding axis of the vibrator substrate 21, the remaining one axes may coincide with each other. In addition, the X axis, the Y axis, and the Z axis of the substrate 31 may coincide with the X axis, the Y axis, and the Z axis of the vibrator substrate 21, respectively.

When the relay substrate 3 is again described, as illustrated in FIG. 11, the relay substrate 3 includes the terminals 389 and 399 disposed on the lower surface thereof (surface on the side where the vibrator element 2 is disposed). The terminal 389 is formed as a portion of the wiring 38, and the terminal 399 is formed as a portion of the wiring 39. Therefore, each of the terminals 389 and 399 is electrically coupled to the vibrator element 2.

These terminals 389 and 399 function as frequency measurement terminals used for frequency measurement of the vibrator element 2, respectively. By disposing the frequency measurement terminals 389 and 399 on the relay substrate 3 in this manner, since the vibrator element 2 can be driven using the terminals 389 and 399 to monitor the oscillation frequency, for example, in a state (state of laminated structure 10) where the vibrator element 2 is bonded to the circuit element 4 through the relay substrate 3, the frequency of the vibrator element 2 can be adjusted in this state. Therefore, it is possible to finish the frequency adjustment of the vibrator element 2 before mounting the vibrator element 2 on the package 5, and thereafter, in a case of mounting the circuit element 4 on the base 51 (package 5), the mounting stress applied to the relay substrate 3 and the vibrator element 2 is reduced, and the frequency variation of the vibrator element 2 after the frequency adjustment is suppressed. In addition, even in a case where the frequency of the vibrator element 2 is out of specification, the package 5 is not wasted. Therefore, according to the vibrator device 1, the manufacturing cost can be reduced.

In addition, the terminals 389 and 399 are disposed in a region overlapping with the circuit element 4 and not overlapping with the vibrator element 2 on the lower surface of the substrate 31 in a plan view of the relay substrate 3. In the embodiment, the terminals 389 and 399 are disposed in a region outside the vibrator element 2 on the lower surface of the substrate 31 in the plan view of the relay substrate 3. As a result, it is easy to press a probe against the terminals 389 and 399 without being disturbed by the circuit element 4 or the vibrator element 2 when measuring the frequency of the vibrator element 2. Therefore, it is possible to easily measure the vibration frequency of the vibrator element 2.

In addition, the terminal 389 is disposed on the edge portion 321 of the support portion 32, and the terminal 399 is disposed on the edge portion 322 of the support portion 32. By disposing the terminals 389 and 399 on the support portion 32 in this manner, it is possible to sufficiently separate the terminals 389 and 399 from the vibrator element 2 in a plan view. Therefore, it is easy to press the probe against the terminals 389 and 399. In particular, in the embodiment, the terminals 389 and 399 are disposed so as to overlap with the connection bumps B2 in a plan view. As a result, the terminals 389 and 399 are supported by the connection bumps B2, and the deflection (deformation) of the relay substrate 3 when the probes are pressed against the terminals 389 and 399 can be suppressed. Therefore, when measuring the frequency of the vibrator element 2, it is possible to effectively suppress the stress generated due to the deformation of the relay substrate 3 (stress which does not occur in the state of the vibrator device 1) from being applied to the vibrator element 2. Therefore, the frequency measurement of the vibrator element 2 can be performed with high accuracy.

However, the arrangement of the terminals 389 and 399 is not particularly limited, and for example, both may be disposed at the edge portion 321 or both may be disposed at the edge portion 322. In addition, the terminals 389 and 399 may be disposed at the edge portions 323 and 324, may be disposed on the first rocking portion 33, or may be disposed at the second rocking portion 34.

Hereinbefore, the vibrator device 1 is described. As described above, such a vibrator device 1 includes the base 51, the circuit element 4 (first relay substrate) mounted on the base 51, the relay substrate 3 (second relay substrate) mounted on the circuit element 4, and the vibrator element 2 disposed so as to sandwich the relay substrate 3 with the circuit element 4 and mounted on the relay substrate 3. In addition, the relay substrate 3 includes the terminals 389 and 399 that are electrically coupled to the vibrator element 2, and that are positioned in a region overlapping with the circuit element 4 and not overlapping with the vibrator element 2, in a plan view. According to such a configuration, since the oscillation frequency can be monitored by driving the vibrator element 2 through the terminals 389 and 399, it is possible to adjust the frequency of the vibrator element 2 before storing the vibrator element 2 (laminated structure 10) in the package 5. Thereafter, in a case of mounting the circuit element 4 on the base 51 (package 5), the mounting stress applied to the relay substrate 3 and the vibrator element 2 is reduced, and the frequency variation of the vibrator element 2 after the frequency adjustment is suppressed. In addition, even in a case where the frequency of the vibrator element 2 is outside the specification, at least the package 5 is not wasted. Therefore, according to the vibrator device 1, the manufacturing cost can be reduced. In addition, by having the terminals 389 and 399, it is not necessary to use the terminal 41 when adjusting the frequency of the vibrator element 2. Therefore, contamination of the terminal 41 is suppressed, and electrical connection between the terminal 41 and the internal terminal 53 can be improved. The terminals 389 and 399 may be positioned outside the vibrator element 2 in a plan view as a region not overlapping with the vibrator element 2 in a plan view.

In addition, as described above, the terminals 389 and 399 are disposed on the surface (lower surface) of the relay substrate 3 on the vibrator element 2 side. As a result, when adjusting the frequency of the vibrator element 2, it is easy to press the probe against the terminals 389 and 399 without being disturbed by the circuit element 4 or the vibrator element 2. Therefore, it is possible to easily adjust the vibration frequency of the vibrator element 2.

In addition, as described above, the relay substrate 3 includes the support portion 32 (first portion) mounted on the circuit element 4, the second rocking portion 34 (second portion) where the vibrator element 2 is disposed, and the connection portion 37 connecting the support portion 32 and the second rocking portion 34. As a result, the transmission path of the stress from the support portion 32 to the second rocking portion 34 can be increased. Therefore, the stress caused by the deformation of the base 51 and the circuit element 4 is effectively absorbed or relaxed between the support portion 32 and the second rocking portion 34, and it is possible to effectively suppress the stress from being transmitted to the vibrator element 2 on the second rocking portion 34. Therefore, a change in the driving characteristics of the vibrator element 2 (especially variation of vibration frequency) hardly occurs, and the vibrator element 2 can exhibit excellent vibration characteristics.

In Particular, in the embodiment, the connection portion 37 includes the first rocking portion 33 (third portion), the beam portion 35 (first beam portion) that connects the support portion 32 and the first rocking portion 33 on the first axis L1, and the beam portion 36 (second beam portion) connecting the first rocking portion 33 and the second rocking portion 34 on the second axis L2 intersecting the first axis L1. As a result, it is possible to cause the transmission path of the stress to meander from the support portion 32 to the second rocking portion 34, so that the transmission path is longer. Therefore, the stress caused by the deformation of the base 51 is more effectively absorbed or relaxed between the support portion 32 and the second rocking portion 34, and it is possible to more effectively suppress the stress from being transmitted to the vibrator element 2 on the second rocking portion 34. Therefore, a change in the driving characteristics of the vibrator element 2 (especially variation of vibration frequency) hardly occurs, and the vibrator element 2 can exhibit excellent vibration characteristics.

In addition, as described above, the support portion 32 has a frame shape, the first rocking portion 33 has a frame shape and is positioned inside the support portion 32, and the second rocking portion 34 is positioned inside the first rocking portion 33. As a result, the first and second rocking portions 33 and 34 can be disposed in a space-saving manner, and the size of the relay substrate 3 can be reduced. However, the configuration of the relay substrate 3 is not limited thereto, and for example, the first and second rocking portions 33 and 34 may be disposed outside the support portion 32.

In addition, as described above, the support portion 32 is mounted on the circuit element 4 through the connection bump B2 (bonding member) on both sides with respect to the first axis L1 in a direction intersecting with the first axis L1. As a result, the relay substrate 3 is supported by the circuit element 4 in a stable posture. Therefore, the posture of the vibrator element 2 is stabilized, and the vibration characteristics are improved.

In addition, as described above, the terminals 389 and 399 are disposed so as to overlap with the connection bumps B2 in a plan view. As a result, the terminals 389 and 399 are supported by the connection bumps B2, and the deflection (deformation) of the relay substrate 3 when the probes are pressed against the terminals 389 and 399 can be suppressed. Therefore, when adjusting the frequency of the vibrator element 2, it is possible to effectively suppress the stress generated due to the deformation of the relay substrate 3 (stress which does not occur in the state of the vibrator device 1) from being applied to the vibrator element 2. Therefore, the frequency adjustment of the vibrator element 2 can be performed with high accuracy.

In addition, as described above, the bonding portions (a plurality of terminals 41) to be mounted on the base 51 of the circuit element 4 are disposed in the region not overlapping with the relay substrate 3 and the vibrator element 2 in a plan view. As a result, the stress caused by deformation of the package 5 is unlikely to be transmitted to the relay substrate 3 or the vibrator element 2. Therefore, the mounting stress applied to the relay substrate 3 and the vibrator element 2 is reduced, and the frequency variation of the vibrator element 2 is suppressed.

In addition, as described above, the vibrator device 1 includes the lid 52 (lid body) bonded to the base 51 so as to store the circuit element 4, the relay substrate 3, and the vibrator element 2 (laminated structure 10) between the lid 52 and the base 51. As a result, it is possible to suitably protect the circuit element 4, the relay substrate 3, and the vibrator element 2 (laminated structure 10) from impact, dust, heat, moisture, and the like.

In addition, as described above, in the vibrator device 1, the first relay substrate is the circuit element 4 having the drive circuit 49 of the vibrator element 2. As a result, the vibrator element 2 can be easily driven.

Next, a method of manufacturing the above vibrator device 1 (frequency adjusting method of vibrator element 2) will be described. As illustrated in FIG. 12, the method of manufacturing the vibrator device 1 includes a wafer preparing step S1 of preparing a wafer 20 on which the vibrator element 2 is formed, a first frequency measuring step S2 of measuring the frequency of the vibrator element 2 in the state of the wafer 20, a detaching step S3 of detaching the vibrator element 2 from the wafer 20, a laminated structure forming step S4 of disposing the vibrator element 2 on the circuit element 4 through the relay substrate 3 to obtain the laminated structure 10, a second frequency measuring step S5 of measuring the frequency of the vibrator element 2, a laminated structure fixing step S6 of disposing the laminated structure 10 on the base 51, and a lid bonding step S7 of bonding the lid 52 to the base 51. Hereinafter, each of these steps will be sequentially described.

Wafer Preparing Step S1

First, a thin plate-shaped wafer 20 made of an AT cut quartz crystal plate is prepared, and the wafer 20 is patterned by etching (dry etching, wet etching, or the like) to form a plurality of vibrator substrates 21 in the wafer 20. Next, a metal film is formed on the surface of the vibrator substrate 21, and the metal film is patterned by etching (dry etching, wet etching, or the like) to form an electrode 22 on the vibrator substrate 21. As a result, as illustrated in FIG. 13, the wafer 20 on which a plurality of vibrator elements 2 are formed is obtained. In the state of the wafer 20, the electrode 22 is drawn out from the vibrator element 2 to a portion of a frame supporting the vibrator element 2, and by applying a probe (electrode pin) against the portion, the vibrator element 2 can be driven on the wafer 20.

First Frequency Measuring Step S2

Next, the frequency of each vibrator element 2 is measured on the wafer 20, and the frequency of each vibrator element 2 is adjusted according to the result. Specifically, as illustrated in FIG. 14, the excitation electrode 221 is irradiated with the ion beam IB through a mask M, and a portion of the excitation electrode 221 is removed (film thickness is reduced) to adjust the frequency of the vibrator element 2. Irradiation with the ion beam IB is preferably performed while applying a driving signal to the vibrator element 2 through the probe, driving the vibrator element 2, and measuring the vibration frequency of the vibrator element 2. As a result, the vibration frequency of the vibrator element 2 can be easily adjusted to a predetermined value. Although the method of measuring the vibration frequency of the vibrator element 2 is not particularly limited, the vibration frequency of the vibrator element 2 may be measured, for example, by measuring an amplitude of the vibrator element 2 with a frequency LDV (laser doppler velocity current meter) while changing the frequency of the drive signal to be applied to the vibrator element 2 by an FFT analyzer.

Although the frequency adjustment amount of the vibrator element 2 in this step is not particularly limited, for example, in a case where the difference between the vibration frequency of the vibrator element 2 before adjustment and the intended vibration frequency is $\Delta f$ Hz, the adjustment amount is preferably 0.25 $\Delta f$ or more and 0.75 $\Delta f$ or less, more preferably 0.4 $\Delta f$ or more and 0.6 $\Delta f$ or less, and even more preferably 0.5 $\Delta f$. As a result, in this step, it is possible to sufficiently adjust the frequency of the vibrator element 2. In addition, excessive frequency adjustment in this step is prevented, and thus in the second frequency measuring step S5 to be performed later, the frequency of the vibrator element 2 can be more reliably adjusted to a target frequency.

In the embodiment, the frequency of the vibrator element 2 is adjusted by irradiating the excitation electrode 221 with the ion beam IB to remove a portion of the excitation electrode 221, but the invention is not limited thereto. The frequency of the vibrator element 2 may be adjusted by irradiating the excitation electrode 222 with the ion beam IB to remove a portion of the excitation electrode 222. The frequency of the vibrator element 2 may be adjusted by irradiating both the excitation electrodes 221 and 222 with the ion beam IB to remove a portion of the excitation electrodes 221 and 222, respectively. In addition, in the embodiment, the excitation electrode 221 is irradiated with the ion beam IB while measuring the vibration frequency of the vibrator element 2, but the invention is not limited thereto. For example, the step of measuring the vibration frequency of the vibrator element 2 and the step of irradiating the excitation electrode 221 with the ion beam IB may be alternately repeated.

Detaching Step S3

Next, the vibrator element 2 is broken off from the wafer 20, and the vibrator element 2 is detached from the wafer 20. However, the method of detaching the vibrator element 2 from the wafer 20 is not particularly limited, and, for example, the vibrator element 2 may be cut off.

Laminated Structure Forming Step S4

Next, as illustrated in FIG. 15, the vibrator element 2 is fixed to the relay substrate 3 through the connection bump B3, and the relay substrate 3 is fixed to the circuit element 4 through the connection bump B2. As a result, the laminated structure 10 in which the circuit element 4, the relay substrate 3, and the vibrator element 2 are laminated is obtained. The vibrator element 2 is fixed to the relay substrate 3 so that the excitation electrode 221 faces the circuit element 4 side. As a result, since the ion beam IB can be irradiated to the excitation electrode 222 in the later second frequency measuring step S5, the excitation electrodes 221 and 222 can be processed in a well-balanced manner by the first and second frequency measuring steps S2 and S5.

Second Frequency Measuring Step S5

Next, the frequency of the vibrator element 2 is measured in the state of the laminated structure 10, and the frequency of the vibrator element 2 is adjusted according to the result. For example, in the first frequency measuring step S2, the reason why the adjustment of the frequency of the vibrator element 2 to a predetermined value is not completed is because mounting stress may be generated and the frequency of the vibrator element 2 may change by fixing the vibrator element 2 to the relay substrate 3 and fixing the relay substrate 3 to the circuit element 4. By performing this step, it is possible to adjust the frequency of the vibrator element 2 more accurately.

In this step, as illustrated in FIG. 16, the excitation electrode 222 is irradiated with the ion beam IB through the mask M, and a portion of the excitation electrode 222 is removed (film thickness is reduced) to adjust the frequency of the vibrator element 2. In addition, this step is performed, for example, in a state where the laminated structure 10 is placed on a jig 9 as illustrated in FIG. 17. The jig 9 includes a probe 91, and when the laminated structure 10 is placed on the jig 9, the probe 91 is come into contact with the terminals 389 and 399 of the relay substrate 3. In addition, the jig 9 includes an opening portion 92 for avoiding contact with the vibrator element 2. According to such a jig 9, it is possible to apply a drive signal to the vibrator element 2 through the probe 91, so that the frequency adjustment of the vibrator element 2 can be easily performed. As described above, since the terminals 389 and 399 are disposed in the region not overlapping with the vibrator element 2, the laminated structure 10 has a structure that causes the probe 91 to be likely to come into contact with the terminals 389 and 399.

Irradiation of the ion beam IB is preferably performed while applying a driving signal to the vibrator element 2 through the probe 91, driving the vibrator element 2, and measuring the vibration frequency of the vibrator element 2. As a result, the vibration frequency of the vibrator element 2 can be easily adjusted to a predetermined value. The method of measuring the vibration frequency of the vibrator element 2 is not particularly limited, and for example, the same method as the above-described first frequency measuring step S2 can be used.

Here, since the frequency of the vibrator element 2 is adjusted to some extent in the first frequency measuring step S2, the frequency adjustment amount in this step is reduced and the attack on the relay substrate 3 and the circuit element 4 due to the ion beam IB is reduced accordingly. Therefore, it is possible to reduce the damage of the relay substrate 3 and the circuit element 4, and it is possible to effectively suppress breakage (failure) of the relay substrate 3 and the circuit element 4.

In addition, in the first frequency measuring step S2, the excitation electrode 221 is processed, and in the second frequency measuring step S5, the excitation electrode 222 is processed. As a result, the excitation electrodes 221 and 222 can be processed in a well-balanced manner, and the mass difference between the excitation electrodes 221 and 222 can be suppressed to a small value. Therefore, the vibrator element 2 capable of stable driving can be obtained. In particular, in the first frequency measuring step S2, the frequency adjustment of approximately 0.5 Δf is performed, and in the second frequency measuring step, the frequency adjustment of the remaining approximately 0.5 Δf is performed. Accordingly, the mass difference between the excitation electrodes 221 and 222 can be further suppressed to a small value.

In the embodiment, the frequency of the vibrator element 2 is adjusted by irradiating the excitation electrode 222 with the ion beam IB to remove a portion of the excitation electrode 222, but the invention is not limited thereto. The frequency of the vibrator element 2 may be adjusted by irradiating the excitation electrode 221 with the ion beam IB to remove a portion of the excitation electrode 221. In this case, in the laminated structure forming step S4, the vibrator element 2 may be fixed to the relay substrate 3 so that the excitation electrode 222 faces the circuit element 4 side. In addition, in the embodiment, the excitation electrode 222 is irradiated with the ion beam IB while measuring the vibration frequency of the vibrator element 2, and the invention is not limited thereto. For example, the step of measuring the vibration frequency of the vibrator element 2 and the step of irradiating the excitation electrode 222 with the ion beam IB may be alternately repeated.

Laminated Structure Fixing Step S6

Next, as illustrated in FIG. 18, the circuit element 4 is fixed to the base 51 through the connection bump B1. As described above, since the vibrator element 2 is fixed to the circuit element 4 through the relay substrate 3, the stress from the base 51 and the circuit element 4 is hard to apply to the vibrator element 2. Therefore, the frequency of the vibrator element 2 due to fixing the circuit element 4 to the base 51 is unlikely to change (even if the frequency changes, it is a trace amount), and it is not necessary to further adjust the frequency of the vibrator element 2 after fixing the circuit element 4 to the base 51. Therefore, adjustment of the frequency of the vibrator element 2 can be completed before fixing the vibrator element 2 to the base 51, and even in a case where the frequency of the vibrator element 2 is out of specification, the vibrator element 2 can be, for example, discarded at the stage of the laminated structure 10, and at least the base 51 is not wasted. Therefore, according to such a manufacturing method, the manufacturing cost of the vibrator device 1 can be reduced.

Lid Bonding Step S7

Next, as illustrated in FIG. 19, the lid 52 is bonded to the base 51. As a result, the package 5 storing the laminated structure 10 is formed, and the vibrator device 1 is obtained.

Hereinbefore, the method of manufacturing the vibrator device 1 is described. As described above, the method of manufacturing the vibrator device 1 includes a step of preparing the laminated structure 10 (laminated structure forming step S4) having the circuit element 4, the relay substrate 3 mounted on the circuit element 4, and the vibrator element 2 disposed so as to sandwich the relay substrate 3 with the circuit element 4 and mounted on the relay substrate 3, and a step of measuring the frequency of the vibrator element 2 (second frequency measuring step S5). In addition, the relay substrate 3 includes the terminals 389 and 399 that is electrically coupled to the vibrator element 2, and that is positioned in the region overlapping with the circuit element 4 and not overlapping with the vibrator element 2 in a plan view. In the step of measuring the frequency of the vibrator element 2 (second frequency measuring step S5), the frequency of the vibrator element 2 is measured through the terminals 389 and 399. According to such a method, since the oscillation frequency can be monitored by driving the vibrator element 2 through the terminals 389 and 399, it is possible to adjust the frequency of the vibrator element 2 before storing the vibrator element 2 (laminated structure 10) in the package 5. Thereafter, in a case where the circuit element 4 is mounted on the base 51 (package 5), the mounting stress applied to the relay substrate 3 and the vibrator element 2 is reduced, and the frequency variation of the vibrator element 2 after the frequency adjustment is suppressed. In addition, even in a case where the frequency of the vibrator element 2 is out of specification, the vibrator element 2 can be discarded before being fixed to the base 51, and at least the base 51 is not wasted. Therefore, according to such a manufacturing method, the manufacturing cost of the vibrator device 1 can be reduced. In addition, by having the terminals 389 and 399, it is not necessary to use the terminal 41 in the second frequency measuring step S5. Therefore, contamination of the terminal 41 is suppressed, and the terminal 41 and the internal terminal 53 can be electrically coupled to each other more reliably with low resistance in the laminated structure fixing step S6.

In addition, as described above, the method of manufacturing the vibrator device 1 includes the first frequency measuring step S2, which is performed prior to the laminated structure forming step S4 of preparing the laminated structure 10, of measuring the frequency of the vibrator element 2 in a state not supported by the relay substrate 3. As a result, the frequency adjustment amount in the second frequency measuring step S5 decreases, and the attack on the relay substrate 3 and the circuit element 4 due to the ion beam IB is reduced accordingly. Therefore, it is possible to reduce the damage of the relay substrate 3 and the circuit element 4 received in the second frequency measuring step S5, and it is possible to effectively suppress breakage (failure) of the relay substrate 3 and the circuit element 4.

In addition, as described above, the vibrator element 2 includes the vibrator substrate 21, the excitation electrode 221 (first excitation electrode) disposed on one main surface of the vibrator substrate 21, and the excitation electrode 222 (second excitation electrode) disposed on the other main surface. In the first frequency measuring step S2 of measuring the frequency of the vibrator element 2 in the state not supported by the relay substrate 3, the excitation electrode 221 is processed. In the second frequency measuring step S5 of measuring the frequency of the vibrator element 2 in the state of the laminated structure 10, the excitation electrode 222 is processed. As a result, the excitation electrodes 221 and 222 can be processed in a well-balanced manner, and the mass difference between the excitation electrodes 221 and 222 can be suppressed to a small value. Therefore, the vibrator element 2 capable of stable driving can be obtained.

In addition, as described above, the method of manufacturing the vibrator device 1 includes the laminated structure fixing step S6, which is performed after the second frequency measuring step S5 of measuring the frequency of the vibrator element 2 in the state of the laminated structure 10, of disposing the circuit element 4 on the base 51, and the lid bonding step S7 of bonding the lid 52 (lid body) to the base 51 so as to store the laminated structure 10 between the lid 52 and the base 51. As a result, the laminated structure 10 can be protected from moisture, dust, shock, and the like.

Second Embodiment

Next, an electronic apparatus according to a second embodiment of the invention will be described.

Figure 20:
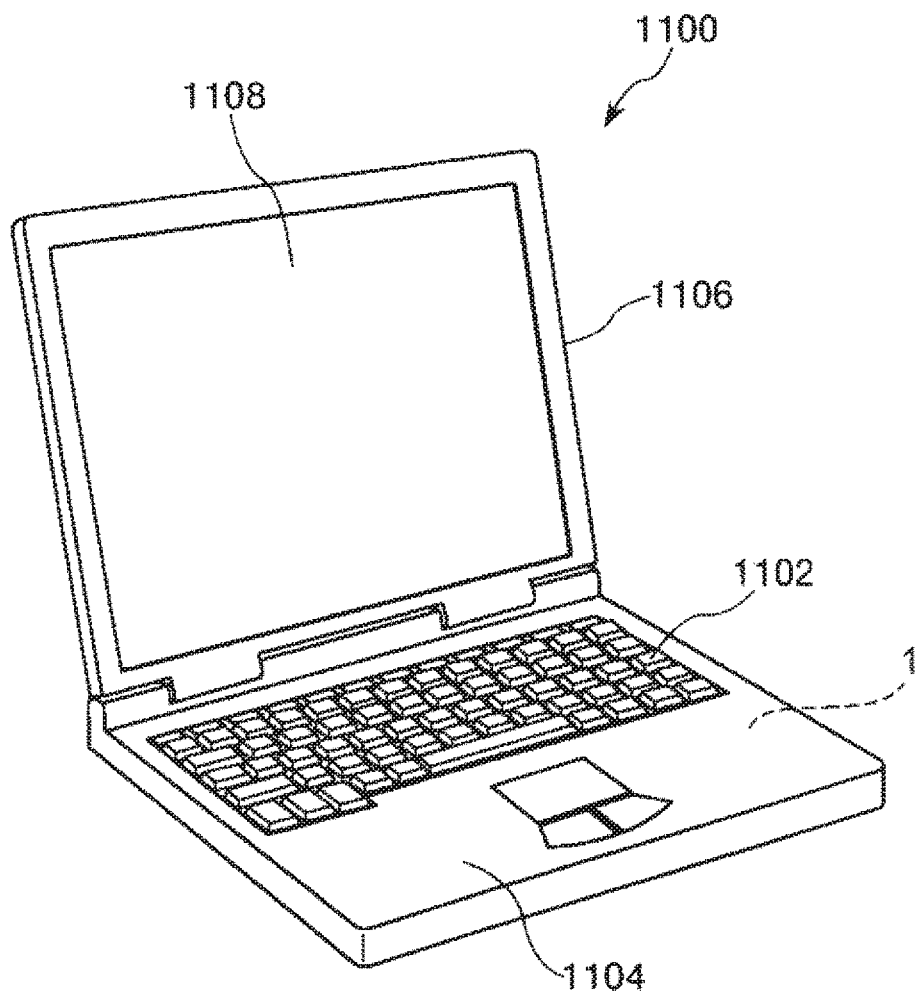
FIG. 20 is a perspective view illustrating an electronic apparatus according to a second embodiment of the invention.

FIG. 20 is a perspective view illustrating an electronic apparatus according to a second embodiment of the invention.

A mobile type (or notebook type) personal computer 1100 illustrated in FIG. 20 is a device to which the electronic apparatus including the vibrator device according to the invention is applied. In the drawing, the personal computer 1100 is configured to include a main body portion 1104 having a keyboard 1102 and a display unit 1106 having a display portion 1108. The display unit 1106 is rotatably mounted on the main body portion 1104 through a hinge structure portion. In such a personal computer 1100, for example, the vibrator device 1 used as an oscillator is incorporated.

Such a personal computer 1100 (electronic apparatus) includes the vibrator device 1. Therefore, the effect of the vibrator device 1 described above can be enjoyed, and high reliability can be exhibited.

Third Embodiment

Next, an electronic apparatus according to a third embodiment of the invention will be described.

Figure 21:
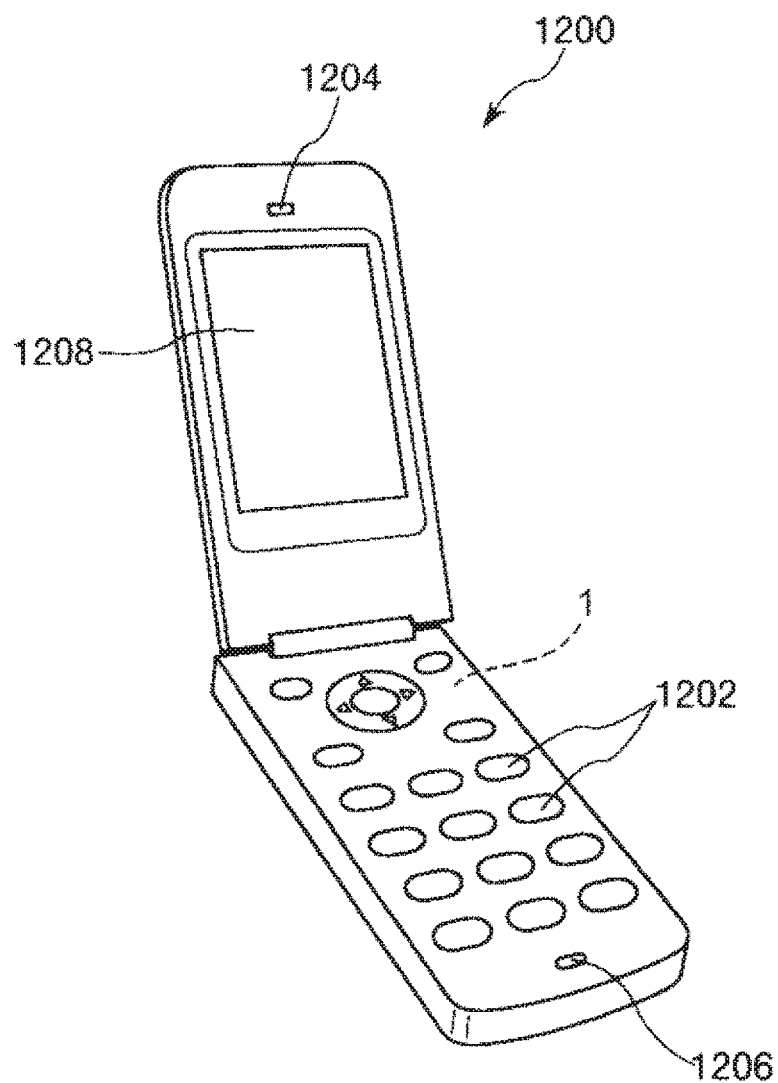
FIG. 21 is a perspective view illustrating an electronic apparatus according to a third embodiment of the invention.

FIG. 21 is a perspective view illustrating an electronic apparatus according to a third embodiment of the invention.

A mobile phone 1200 (including PHS) illustrated in FIG. 21 is a device to which the electronic apparatus including the vibrator device according to the invention is applied. The mobile phone 1200 is provided with an antenna (not illustrated), a plurality of operation buttons 1202, an earpiece 1204, and a mouthpiece 1206. A display portion 1208 is disposed between the operation button 1202 and the earpiece 1204. In such a mobile phone 1200, for example, the vibrator device 1 used as an oscillator is incorporated.

Such a mobile phone 1200 (electronic apparatus) includes the vibrator device 1. Therefore, the effect of the vibrator device 1 described above can be enjoyed, and the high reliability can be exhibited.

Fourth Embodiment

Next, an electronic apparatus according to a fourth embodiment of the invention will be described.

Figure 22:
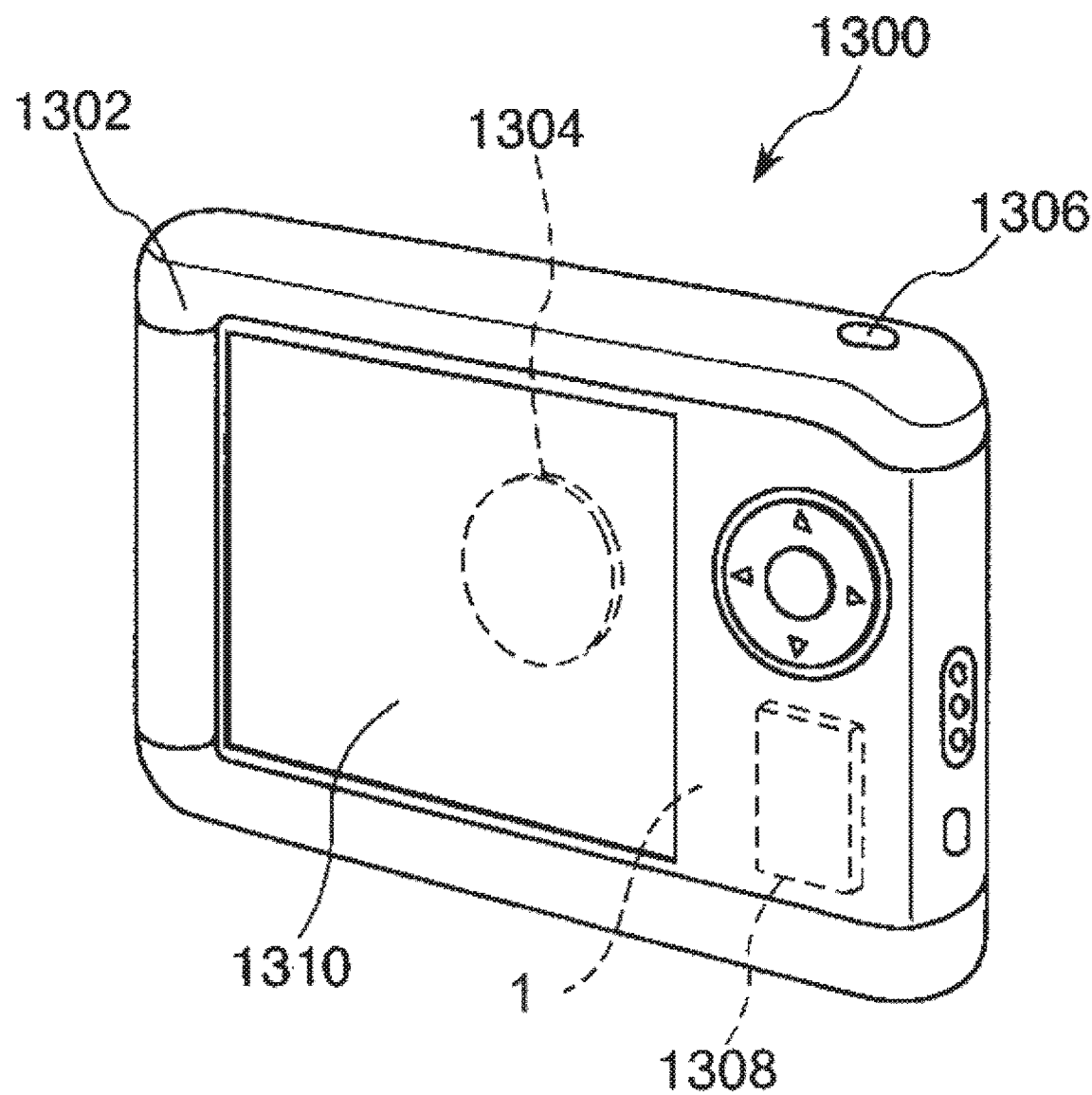
FIG. 22 is a perspective view illustrating an electronic apparatus according to a fourth embodiment of the invention.

FIG. 22 is a perspective view illustrating an electronic apparatus according to a fourth embodiment of the invention.

A digital still camera 1300 illustrated in FIG. 22 is a device to which the electronic apparatus including the vibrator device according to the invention is applied. A display portion 1310 is provided on a rear surface of a case (body) 1302 and is configured to perform display based on an image pickup signal by the CCD. The display portion 1310 functions as a finder that displays a subject as an electronic image. In addition, a light receiving unit 1304 including an optical lens (image pickup optical system) and a CCD and the like is provided on the front side (rear side in the drawing) of the case 1302. When a photographer confirms the subject image displayed on the display portion 1310 and presses a shutter button 1306, the imaging signal of the CCD at that time is transferred and stored in a memory 1308. In such a digital still camera 1300, for example, the vibrator device 1 used as an oscillator is incorporated.

Such a digital still camera 1300 (electronic apparatus) includes the vibrator device 1. Therefore, the effect of the vibrator device 1 described above can be enjoyed, and the high reliability can be exhibited.

The electronic apparatus according to the invention can be applied to, for example, a smartphone, a tablet terminal, a clock (including a smart watch), an ink jet type ejecting device (such as an ink jet printer), a laptop personal computer, a TV, a wearable terminals such as a head mounted display (HMD), a video camera, a video tape recorder, a car navigation device, a pager, an electronic notebook (including electronic notebook with communication function), an electronic dictionary, a calculator, an electronic game machine, a word processor, a workstation, a videophone, a TV monitor for security, an electronic binoculars, a POS terminal, medical equipment (such as an electronic clinical thermometer, a blood pressure monitor, a blood glucose meter, an electrocardiogram measuring device, an ultrasonic diagnostic device, and an electronic endoscope), a fish finder, various measuring instruments, equipment for mobile terminal base stations, instruments (such as instruments of vehicles, aircraft, and ships), a flight simulator, a network server, and the like, in addition to the above-described personal computer, a cellular phone, and a digital still camera.

Fifth Embodiment

Next, an electronic apparatus according to a fifth embodiment of the invention will be described.

Figure 23:
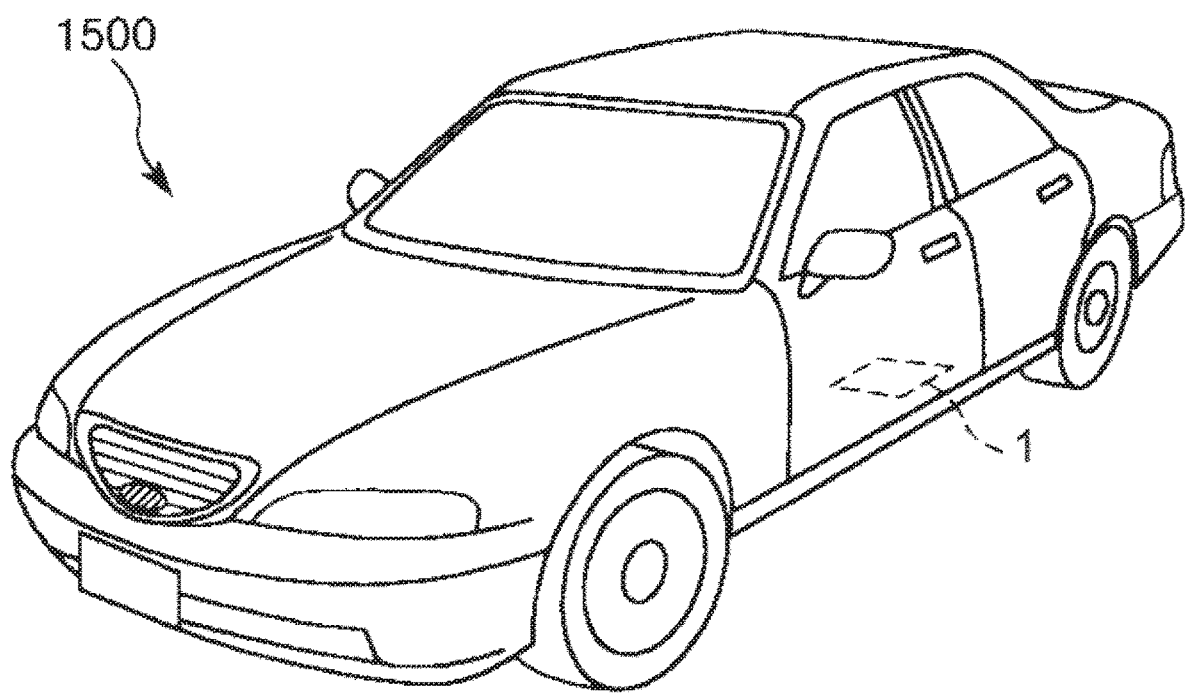
FIG. 23 is a perspective view illustrating a vehicle according to a fifth embodiment of the invention.

FIG. 23 is a perspective view illustrating a vehicle according to a fifth embodiment of the invention.

An automobile 1500 illustrated in FIG. 23 is an automobile to which the vehicle including the vibrator device according to the invention is applied. In such an automobile 1500, for example, the vibrator device 1 used as an oscillator is incorporated. The vibrator device 1 can be widely applied to, for example, an electronic control unit (ECU) such as a keyless entry, an immobilizer, a car navigation system, a car air conditioner, an anti-lock brake system (ABS), an air bag, a tire pressure monitoring system (TPMS), an engine control, a battery monitor for hybrid cars and electric cars, and a vehicle body attitude control system.

Such an automobile 1500 (vehicle) includes the vibrator device 1. Therefore, the effect of the vibrator device 1 described above can be enjoyed, and the high reliability can be exhibited.

The vehicle is not limited to the automobile 1500, and can also be applied to an airplane, a ship, an automatic guided vehicle (AGV), a biped walking robot, an unmanned airplane such as drone, and the like.

Hereinbefore, although the vibrator device, the method of manufacturing the vibrator device, the electronic apparatus, and the vehicle according to the invention are described based on the illustrated embodiments, the invention is not limited thereto. The configuration of each part can be replaced with an arbitrary configuration having the same function. In addition, any other constituent may be added to the invention. In addition, the invention may be a combination of arbitrary two or more configurations (features) of each of the above embodiments.

In addition, in the above-described embodiment, the configuration in which the vibrator device is applied to the oscillator is described, and the invention is not limited thereto. For example, the vibrator device may be applied to a physical quantity sensor capable of detecting physical quantities such as acceleration and angular velocity. In this case, as the vibrator element 2, an element having a drive vibration mode and a detection vibration mode excited according to the received physical quantity may be used. The circuit element 4 may be formed with a drive circuit for driving the vibrator element 2 in the drive vibration mode and a detection circuit for detecting the physical quantity based on a signal obtained from the detection vibration mode of the vibrator element 2.

The entire disclosure of Japanese Patent Application No. 2017-252478, filed Dec. 27, 2017 is expressly incorporated by reference herein.

What is claimed is:

1. A vibrator device comprising:
    a base;
    a first relay substrate mounted on the base;
    a second relay substrate mounted on the first relay substrate; and
    a vibrator element mounted on the second relay substrate, wherein:
    the second relay substrate is disposed between the first relay substrate and the vibrator,
    the second relay substrate includes a terminal that is electrically coupled to the vibrator element and is positioned in a region overlapping with the first relay substrate and not overlapping the vibrator element in a plan view, and
    the vibrator element is provided between the first relay substrate and the base that is connected to the terminal.

2. The vibrator device according to claim 1, wherein the terminal is disposed on a surface of the second relay substrate facing the vibrator element.

3. The vibrator device according to claim 1, wherein the second relay substrate includes
    a first portion mounted on the first relay substrate,
    a second portion on which the vibrator element is disposed, and
    a connection portion that connects the first portion and the second portion.

4. The vibrator device according to claim 3, wherein the connection portion includes
    a third portion,
    a first beam portion that connects the first portion and the third portion on a first axis, and
    a second beam portion that connects the second portion and the third portion on a second axis intersecting with the first axis.

5. The vibrator device according to claim 4, wherein
    the first portion has a frame shape,
    the third portion has a frame shape and is positioned inside the first portion, and
    the second portion is positioned inside the third portion.

6. The vibrator device according to claim 3, wherein the first portion is mounted on the first relay substrate through bonding members on both sides with respect to the first axis in a direction intersecting with the first axis.

7. The vibrator device according to claim 6, wherein the terminal is disposed to overlap with each of the bonding members in a plan view.

8. The vibrator device according to claim 1, wherein a bonding portion to be mounted on the base of the first relay substrate is disposed in a region not overlapping with the second relay substrate and the vibrator element in a plan view.

9. The vibrator device according to claim 1, further comprising:
    a lid body that is bonded to the base so as to store the first relay substrate, the second relay substrate, and the vibrator element between the lid body and the base.

10. The vibrator device according to claim 1, wherein the first relay substrate is a circuit element having a drive circuit of the vibrator element.

11. An electronic apparatus comprising:
    the vibrator device according to claim 1;
    a display; and
    a case that houses the vibrator and the display.

12. A vehicle comprising:
    the vibrator device according to claim 1; and
    an electronic control unit configured to control vehicle components.

* * * * *